United States Patent
Shimizu

(10) Patent No.: US 11,901,430 B2
(45) Date of Patent: Feb. 13, 2024

(54) SEMICONDUCTOR DEVICE, METHOD OF MANUFACTURING SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/988,374

(22) Filed: Nov. 16, 2022

(65) Prior Publication Data

US 2023/0079954 A1   Mar. 16, 2023

Related U.S. Application Data

(62) Division of application No. 17/176,215, filed on Feb. 16, 2021, now Pat. No. 11,532,721.

(30) Foreign Application Priority Data

May 14, 2020   (JP) .................. 2020-084887

(51) Int. Cl.
*H01L 29/47* (2006.01)
*H01L 29/16* (2006.01)
*H01L 29/872* (2006.01)
*H01L 29/78* (2006.01)
(Continued)

(52) U.S. Cl.
CPC .......... *H01L 29/47* (2013.01); *H01L 21/0495* (2013.01); *H01L 29/1608* (2013.01); *H01L 29/7806* (2013.01); *H01L 29/872* (2013.01); *H02P 27/06* (2013.01)

(58) Field of Classification Search
None
See application file for complete search history.

(56) References Cited

U.S. PATENT DOCUMENTS 6,214,107 B1 *  4/2001  Kitabatake ............ H01L 29/267
                                                    257/E21.054
10,141,410 B2    11/2018  Shimizu
11,532,721 B2 *  12/2022  Shimizu ............ H01L 29/66068
(Continued)

FOREIGN PATENT DOCUMENTS

JP   2005536070 A   11/2005
JP      6158153 B2    6/2017
(Continued)

OTHER PUBLICATIONS

Tanimoto et al., "Toward a better understanding of Ni2Si-based contact on SiC", ECSCRM, 2010, abstract, 1 page.

*Primary Examiner* — Xiaoming Liu
(74) *Attorney, Agent, or Firm* — Maier & Maier, PLLC

(57) ABSTRACT

According to an embodiment, provided is a semiconductor device including: a first electrode; a second electrode; and a silicon carbide layer disposed between the first electrode and the second electrode, the silicon carbide layer including: a first silicon carbide region of an n-type; and a second silicon carbide region disposed between the first silicon carbide region and the first electrode, the second silicon carbide being in contact with the first electrode, and the second silicon carbide containing one oxygen atom bonding with four silicon atoms.

4 Claims, 33 Drawing Sheets

(51) Int. Cl.
*H01L 21/04* (2006.01)
*H02P 27/06* (2006.01)

(56) References Cited

U.S. PATENT DOCUMENTS

| | | |
|---|---|---|
| 2004/0026687 A1 | 2/2004 | Grupp et al. |
| 2016/0087043 A1 | 3/2016 | Shimizu |
| 2016/0111499 A1 | 4/2016 | Hisamoto et al. |
| 2017/0200787 A1* | 7/2017 | Shimizu ................ H01L 29/36 |
| 2018/0144938 A1 | 5/2018 | Togawa et al. |

FOREIGN PATENT DOCUMENTS

| | | |
|---|---|---|
| JP | 2017-126604 A | 7/2017 |
| JP | 2018085382 A | 5/2018 |
| WO | 2014155651 A | 10/2014 |

\* cited by examiner

SEMICONDUCTOR DEVICE, METHOD OF MANUFACTURING SEMICONDUCTOR DEVICE, INVERTER CIRCUIT, DRIVE DEVICE, VEHICLE, AND ELEVATOR

CROSS-REFERENCE TO RELATED APPLICATION

This application is a divisional of U.S. patent application Ser. No. 17/176,215, filed on Feb. 16, 2021, which is based upon and claims the benefit of priority from Japanese Patent Application No. 2020-084887, filed on May 14, 2020, the entire contents of each of which are incorporated herein by reference.

FIELD

Embodiments described herein relate generally to semiconductor devices, methods of manufacturing semiconductor device, inverter circuits, drive devices, vehicles, and elevators.

BACKGROUND

A silicon carbide (SiC) is expected as a material for next-generation semiconductor devices. The silicon carbide has excellent physical properties such as a band gap of about 3 times that of silicon (Si), a breakdown field strength of about 10 times that of silicon (Si), and a thermal conductivity of about 3 times that of silicon (Si). By utilizing this characteristic, a semiconductor device capable of low loss and high temperature operation can be realized.

In a Schottky barrier diode (SBD) using a silicon carbide, if the height of the Schottky barrier between the silicon carbide layer and the electrode varies, a variation in rectification characteristics of the SBD occurs. Therefore, it is desired to realize a semiconductor device in which a variation in height of the Schottky barrier is suppressed.

DETAILED DESCRIPTION

Figure 1:
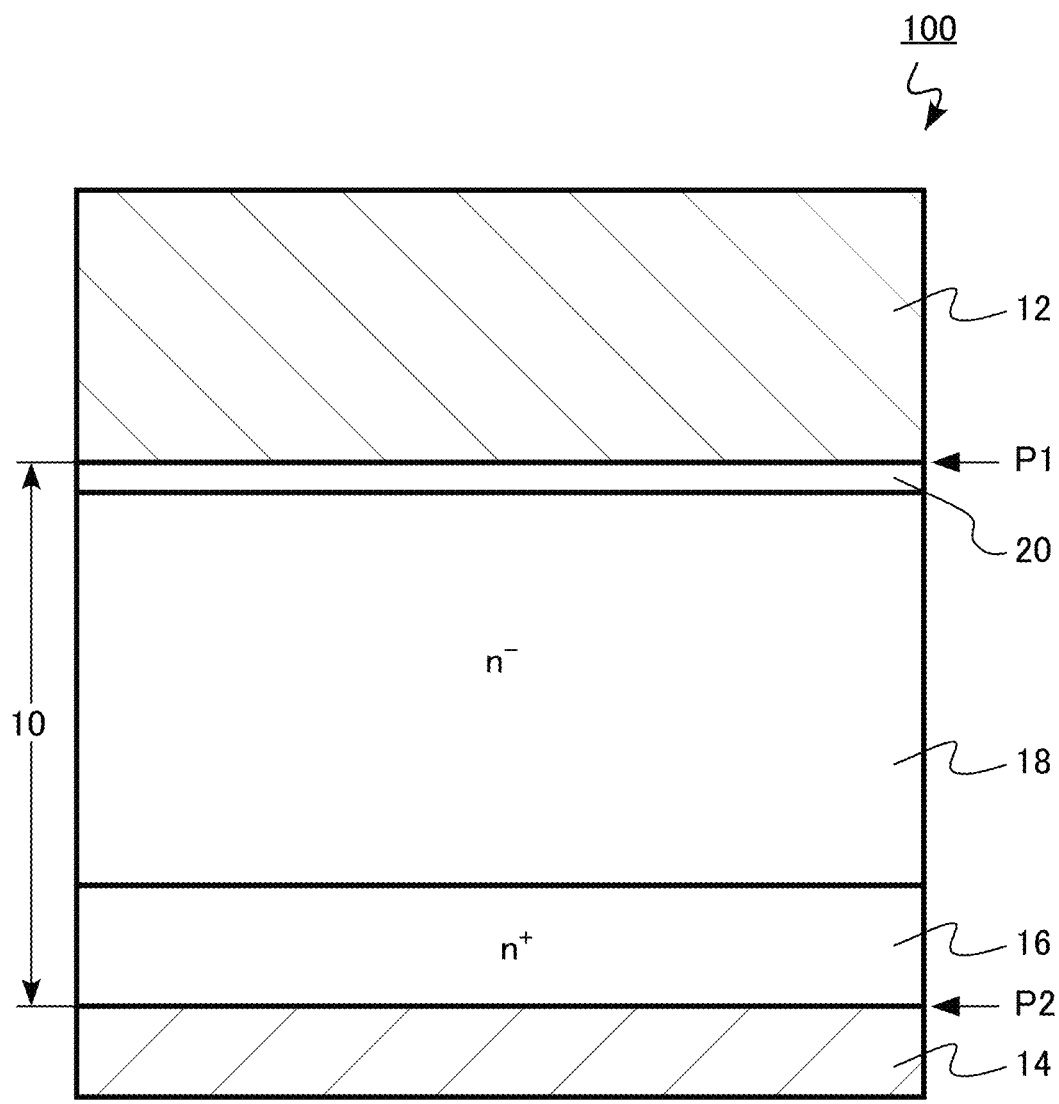
FIG. 1 is a schematic cross-sectional view of a semiconductor device according to a first embodiment.

According to an embodiment, a semiconductor device includes: a first electrode; a second electrode; and a silicon carbide layer disposed between the first electrode and the second electrode, the silicon carbide layer including: a first silicon carbide region of an n-type; and a second silicon carbide region disposed between the first silicon carbide region and the first electrode, the second silicon carbide region being in contact with the first electrode, and the second silicon carbide region containing one oxygen atom bonding with four silicon atoms.

Hereinafter, embodiments will be described with reference to the drawings. In addition, in the following description, the same or similar members and the like are denoted by the same reference numerals, and the description of the members and the like once described will be omitted as appropriate.

In addition, in the following description, the notations of $n^+$, n, $n^-$ and $p^+$, p, $p^-$ indicate the relative level of the impurity concentrations in the respective conductivity type. That is, $n^+$ indicates that the concentration of n-type impurities is relatively higher than n, and $n^-$ indicates that the concentration of n-type impurities is relatively lower than that of n. In addition, $p^+$ indicates that the p-type impurity concentration is relatively higher than p, and $p^-$ indicates that the p-type impurity concentration is relatively lower than p. In addition, in some cases, $n^+$-type and $n^-$-type may be simply referred to as n-type, and $p^+$-type and $p^-$-type may be simply referred to as p-type. Unless otherwise stated, the impurity concentration in each region is represented by, for example, the value of the impurity concentration in the central portion of each region.

The impurity concentration can be measured by, for example, secondary ion mass spectrometry (SIMS). In addition, the relative level of the impurity concentration can be determined from, for example, the level of the carrier concentration obtained by scanning capacitance microscopy (SCM). In addition, the distance such as the width and depth of the impurity region can be obtained by, for example, SIMS. In addition, the distance such as the width and depth of the impurity region can be obtained from, for example, an SCM image.

The depth of the trench, the thickness of the insulating layer, and the like can be measured on, for example, an image of SIMS or transmission electron microscope (TEM).

The bonding state of oxygen atoms in the silicon carbide layer can be identified by using an X-ray photoelectron spectroscopy (XPS) method. In addition, it can be determined by using, for example, Raman spectroscopy whether or not the oxygen atom in the silicon carbide layer is disposed at the carbon site of the crystal structure of the silicon carbide.

First Embodiment

A semiconductor device according to a first embodiment includes: a first electrode; a second electrode; and a silicon carbide layer disposed between the first electrode and the second electrode, the silicon carbide layer including: a first silicon carbide region of an n-type; and a second silicon carbide region disposed between the first silicon carbide region and the first electrode, the second silicon carbide region being in contact with the first electrode, and the second silicon carbide region containing one oxygen atom bonding with four silicon atoms.

FIG. 1 is a schematic cross-sectional view of the semiconductor device according to the first embodiment. The semiconductor device according to the first embodiment is a Schottky barrier diode (SBD). The semiconductor device according to the first embodiment is an SBD 100. The SBD 100 uses electrons as carriers.

The SBD 100 includes a silicon carbide layer 10, an anode electrode 12 (first electrode), and a cathode electrode 14 (second electrode).

The anode electrode 12 is an example of the first electrode. The cathode electrode 14 is an example of the second electrode.

The silicon carbide layer 10 includes a cathode region 16, a drift region 18 (first silicon carbide region) and an oxygen region 20 (second silicon carbide region).

The silicon carbide layer 10 is made of, for example, a single crystal of 4H—SiC. The silicon carbide layer 10 has a first plane P1 and a second plane P2. The second plane P2 faces the first plane P1. The first plane P1 is a front plane of the silicon carbide layer 10, and the second plane P2 is a back plane of the silicon carbide layer 10.

The silicon carbide layer 10 is disposed between the anode electrode 12 and the cathode electrode 14.

In this specification, a "depth" denotes a distance in a direction from the first plane P1 to the second plane P2 with reference to the first plane P1.

Hereinafter, a case where the first plane P1 of the silicon carbide layer 10 is a plane inclined from 0 degrees or more to 10 degrees or less with respect to the silicon face and the second plane P2 is a plane inclined from 0 degrees or more to 10 degrees or less with respect to the carbon face will be described as an example. The first plane P1 of the silicon carbide layer 10 has an off angle of 0 degrees or more and 10 degrees or less with respect to the silicon face.

The cathode region 16 is made of $n^+$ type SiC. The cathode region 16 contains, for example, nitrogen (N) as an n-type impurity. The concentration of n-type impurities in the cathode region 16 is, for example, $1\times10^{18}$ cm$^{-3}$ or more and $1\times10^{21}$ cm$^{-3}$ or less.

The drift region 18 is made of $n^-$ type SiC. The drift region 18 is disposed between the cathode region 16 and the anode electrode 12. The drift region 18 is disposed between the cathode region 16 and the first plane P1.

The drift region 18 contains, for example, nitrogen (N) as an n-type impurity. The concentration of n-type impurities in the drift region 18 is, for example, $1\times10^{15}$ cm$^{-3}$ or more and $2\times10^{16}$ cm$^{-3}$ or less. The concentration of n-type impurities in the drift region 18 is lower than the concentration of n-type impurities in the cathode region 16.

The drift region 18 is, for example, an SiC epitaxial growth layer formed on the cathode region 16 by epitaxial growth. The thickness of the drift region 18 is, for example, 5 μm or more and 100 μm or less.

The oxygen region 20 is made of $n^-$ type SiC. The oxygen region 20 is disposed between the drift region 18 and the anode electrode 12. The oxygen region 20 is disposed between the drift region 18 and the first plane P1. The oxygen region 20 is in contact with the anode electrode 12.

The oxygen region 20 contains oxygen as an impurity. The maximum concentration of oxygen in the oxygen region 20 is, for example, $1\times10^{17}$ cm$^{-3}$ or more and $1\times10^{21}$ cm$^{-3}$ or less.

The oxygen region 20 contains one oxygen atom bonding with four silicon atoms.

The oxygen region 20 contains, for example, nitrogen (N) as an n-type impurity. The concentration of n-type impurities in the oxygen region 20 is, for example, $1\times10^{15}$ cm$^{-3}$ or more and $2\times10^{16}$ cm$^{-3}$ or less.

Figure 2A:
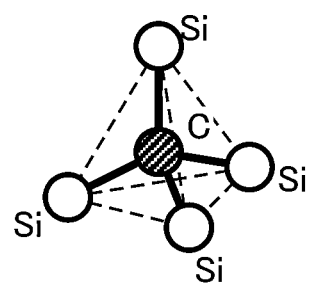
FIGS. 2A and 2B are explanatory views of an oxygen region according to the first embodiment.
Figure 2B:
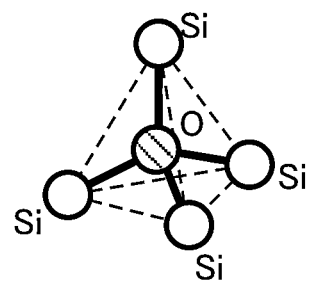

FIGS. 2A and 2B are explanatory views of the oxygen region in the first embodiment. FIG. 2A is a diagram illustrating a crystal structure of a silicon carbide. FIG. 2B is a diagram illustrating a structure existing in the oxygen region 20.

As illustrated in FIG. 2B, one oxygen atom bonding with four silicon atoms exists in the oxygen region 20. In other words, one oxygen atom disposed at the carbon site of the crystal structure of a silicon carbide illustrated in FIG. 2A exists in the oxygen region 20. In other words, the oxygen region 20 has a structure in which one oxygen atom is substituted for carbon atoms in the crystal structure of the silicon carbide.

Figure 3:
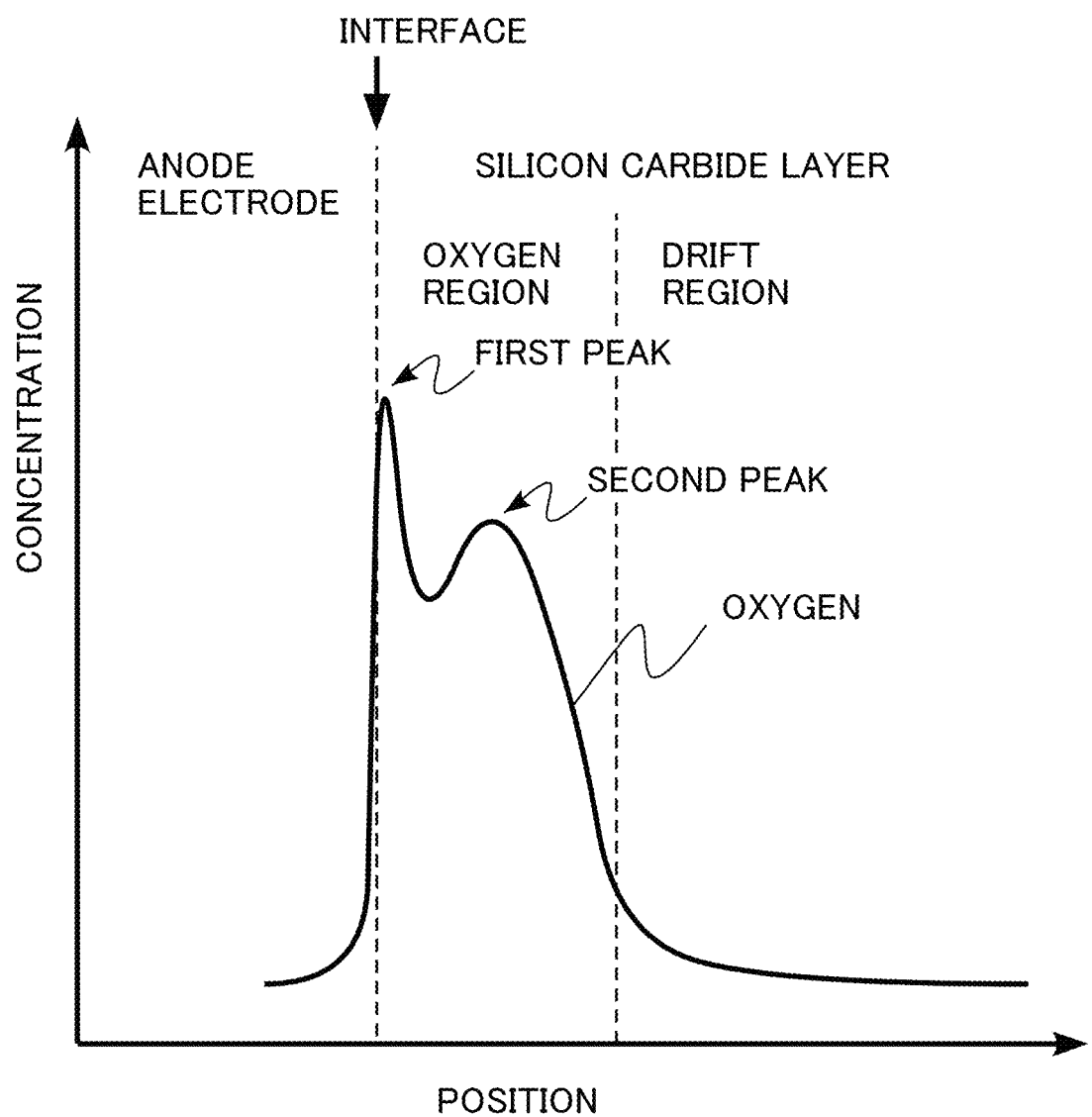
FIG. 3 is a diagram showing a concentration distribution of oxygen of the semiconductor device according to the first embodiment.

FIG. 3 is a diagram showing the concentration distribution of oxygen of the semiconductor device according to the first embodiment. FIG. 3 shows the concentration distribution of oxygen in the anode electrode 12 and the silicon carbide layer 10 in the depth direction. FIG. 3 shows the concentration distribution of oxygen in the anode electrode 12, the oxygen region 20, and the drift region 18 in the depth direction.

The concentration distribution of oxygen in the anode electrode 12 and the oxygen region 20 has a first peak. The distance between the interface between the anode electrode 12 and the oxygen region 20 and the first peak is 1 nm or less. In the oxygen region 20, oxygens are piled up in the interface between the anode electrode 12 and the oxygen region 20.

The oxygen concentration of the first peak is, for example, $1\times10^{17}$ cm$^{-3}$ or more and $1\times10^{21}$ cm$^{-3}$ or less.

The concentration distribution of oxygen in the anode electrode 12 and the oxygen region 20 has a second peak between the first peak and the drift region 18. The oxygen concentration of the second peak is lower than, for example, the oxygen concentration of the first peak.

The anode electrode 12 is disposed on the first plane P1 side of the silicon carbide layer 10. The anode electrode 12 is electrically connected to the oxygen region 20 and the drift region 18.

The anode electrode 12 is in contact with the silicon carbide layer 10. The anode electrode 12 is in contact with the oxygen region 20.

A Schottky contact exists between the anode electrode 12 and the oxygen region 20. The height of the Schottky barrier between the anode electrode 12 and the oxygen region 20 is, for example, 0.7 eV or more and 1.0 eV or less. The height of the Schottky barrier between the anode electrode 12 and the oxygen region 20 is, for example, about 0.8 eV.

The anode electrode 12 is made of a conductor. The anode electrode 12 is made of, for example, a metal, an intermetallic compound, a metal nitride, a metal silicide, or a semiconductor.

The anode electrode 12 may have, for example, a stacked structure. The anode electrode 12 has, for example, a stacked structure of two different types of metals. The anode electrode 12 has, for example, a stacked structure of a metal silicide and a metal.

The anode electrode 12 has, for example, a stacked structure of titanium and aluminum. The anode electrode 12 contains, for example, a nickel silicide. The anode electrode 12 has, for example, a stacked structure of a nickel silicide and aluminum.

The cathode electrode 14 is disposed on the second plane P2 side of the silicon carbide layer 10. The cathode electrode 14 is in contact with the cathode region 16. The cathode electrode 14 is electrically connected to the cathode region 16.

The cathode electrode 14 is made of a conductor. The cathode electrode 14 is made of, for example, a metal, an intermetallic compound, a metal nitride, a metal silicide, or a semiconductor.

The cathode electrode 14 is made of, for example, nickel. The nickel may react with the silicon carbide layer 10 to form the nickel silicide. The nickel silicide is, for example, NiSi and Ni$_2$Si.

Next, an example of a method of manufacturing the semiconductor device according to the first embodiment will be described.

In the method of manufacturing the semiconductor device according to the first embodiment, ion implantation of oxygen into a silicon carbide layer having a first silicon carbide region of an n-type is performed, a conductive film is formed on the silicon carbide layer, and a first heat treatment is performed. In addition, after the ion implantation and before the formation of the conductive film, a second heat treatment at a temperature higher than that of the first heat treatment is further performed.

Figure 4:
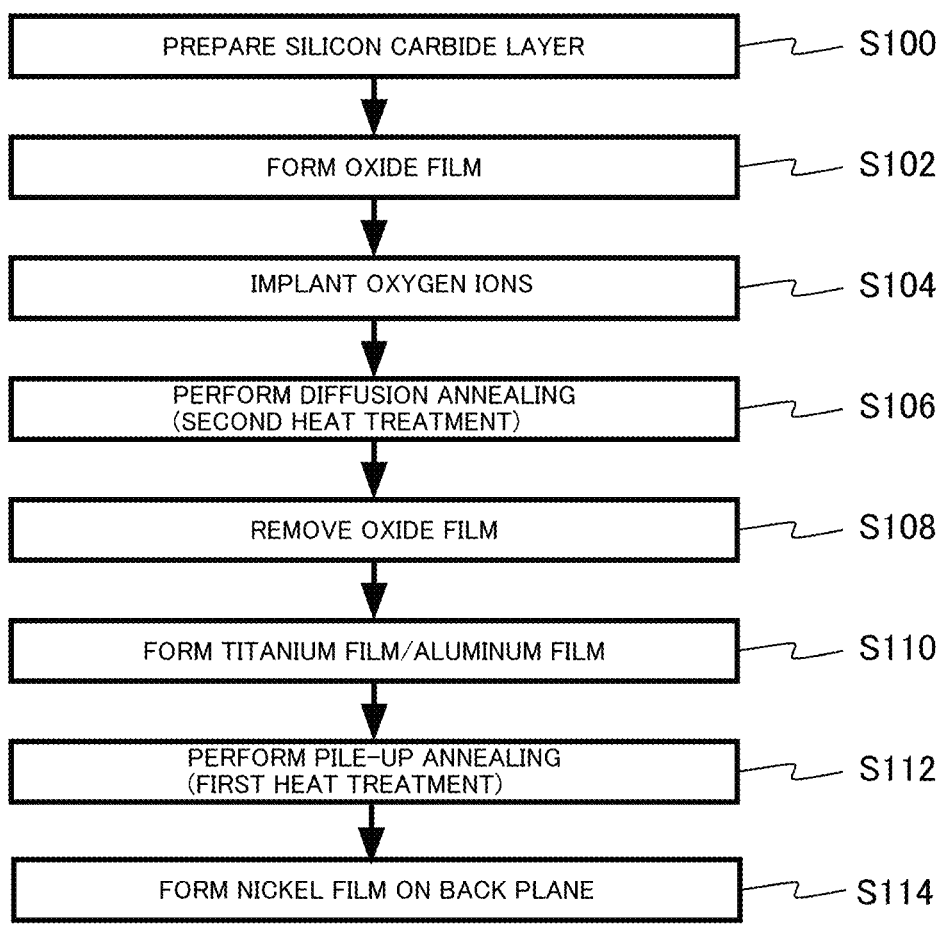
FIG. 4 is a process flowchart illustrating a method of manufacturing the semiconductor device according to the first embodiment.

FIG. 4 is a process flowchart illustrating the method of manufacturing the semiconductor device according to the first embodiment. FIG. 5, FIG. 6, FIG. 7, FIG. 8, and FIG. 9 are schematic cross-sectional views illustrating the method of manufacturing the semiconductor device according to the first embodiment. FIG. 5, FIG. 6, FIG. 7, FIG. 8, and FIG. 9 illustrate cross sections corresponding to FIG. 1.

Hereinafter, a case where the anode electrode 12 has a stacked structure of titanium and aluminum and the cathode electrode 14 is made of nickel will be described as an example.

As illustrated in FIG. 4, the method of manufacturing the semiconductor device includes silicon carbide layer preparation (Step S100), oxide film formation (Step S102), oxygen ion implantation (Step S104), diffusion annealing (Step S106), oxide film removal (Step S108), titanium film/aluminum film formation (Step S110), pile-up annealing (Step S112), and back-plane nickel film formation (Step S114).

Figure 5:
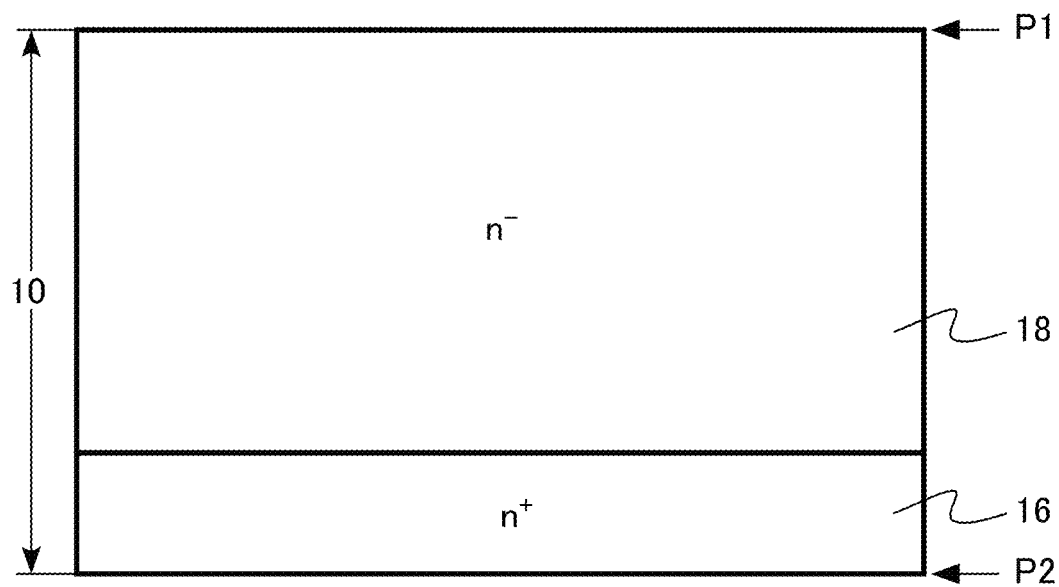
FIG. 5 is a schematic cross-sectional view illustrating the method of manufacturing the semiconductor device according to the first embodiment.

In Step S100, the silicon carbide layer 10 is prepared (FIG. 5). The silicon carbide layer 10 includes an n$^+$ type cathode region 16 and an n$^-$ type drift region 18. The drift region 18 is formed, for example, on the n$^+$ type cathode region 16 by an epitaxial growth method. The silicon carbide layer 10 has a first plane P1 and a second plane P2.

Figure 6:
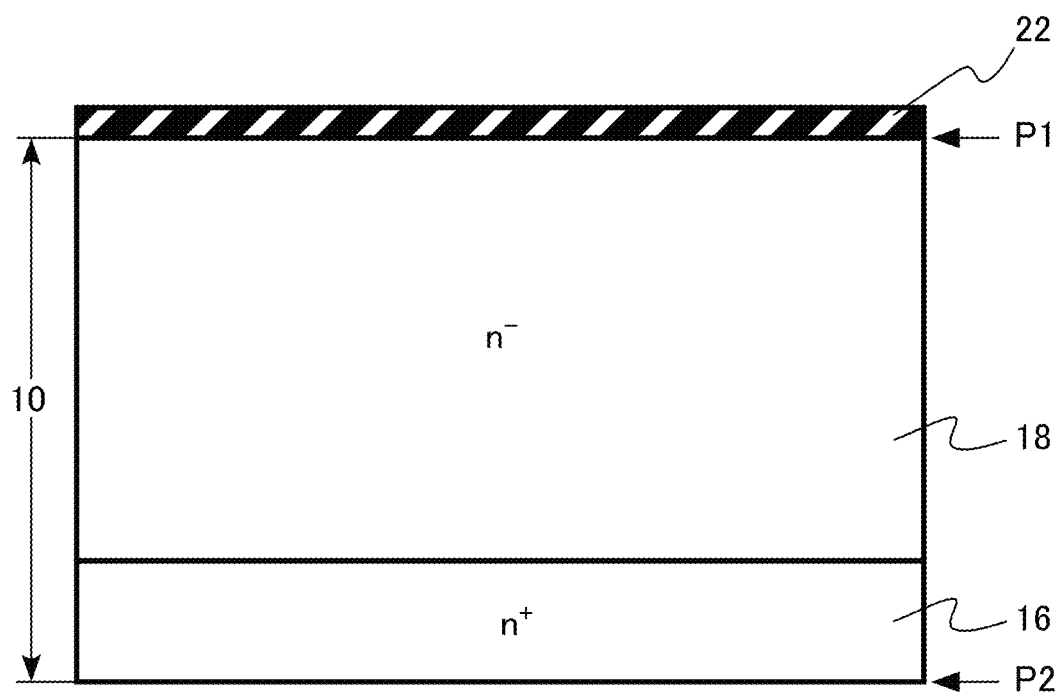
FIG. 6 is a schematic cross-sectional view illustrating the method of manufacturing the semiconductor device according to the first embodiment.

In Step S102, an oxide film 22 is formed on the silicon carbide layer 10 (FIG. 6). The oxide film 22 is formed by a chemical vapor deposition (CVD) method or a thermal oxidation method.

Figure 7:
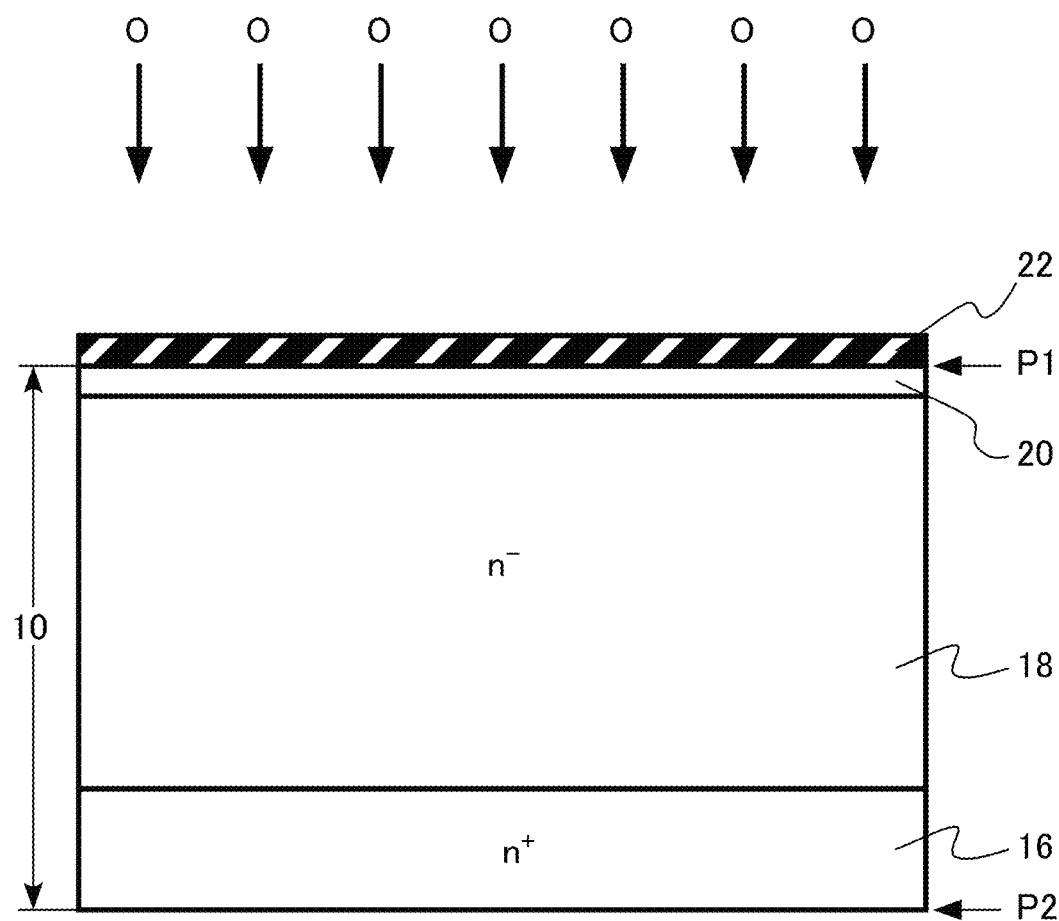
FIG. 7 is a schematic cross-sectional view illustrating the method of manufacturing the semiconductor device according to the first embodiment.

In Step S104, oxygen ions are implanted into the silicon carbide layer 10 (FIG. 7). The oxygen ions passing through the oxide film 22 are introduced into the silicon carbide layer 10. By the ion implantation of oxygen, the carbon bond of the silicon carbide layer 10 is broken, and thus, the carbon vacancies of the silicon carbide layer 10 increase.

By the ion implantation of oxygen, an oxygen region 20 containing oxygen is formed.

In Step S106, the diffusion annealing is performed. The diffusion annealing is an example of the second heat treatment. By the diffusion annealing, oxygens diffuse into the silicon carbide layer 10. In addition, by the diffusion annealing, oxygen atoms enter the carbon vacancy, and thus, a structure is generated in which one oxygen atom is substituted for the carbon atoms in the crystal structure of the silicon carbide.

The diffusion annealing is performed in an atmosphere containing, for example, argon (Ar) or nitrogen (N). The diffusion annealing is performed in an inert gas atmosphere such as argon (Ar) gas.

The temperature of the diffusion annealing is higher than, for example, the temperature of the pile-up annealing performed later. The temperature of the diffusion annealing is, for example, 800° C. or more and 1000° C. or less.

Figure 8:
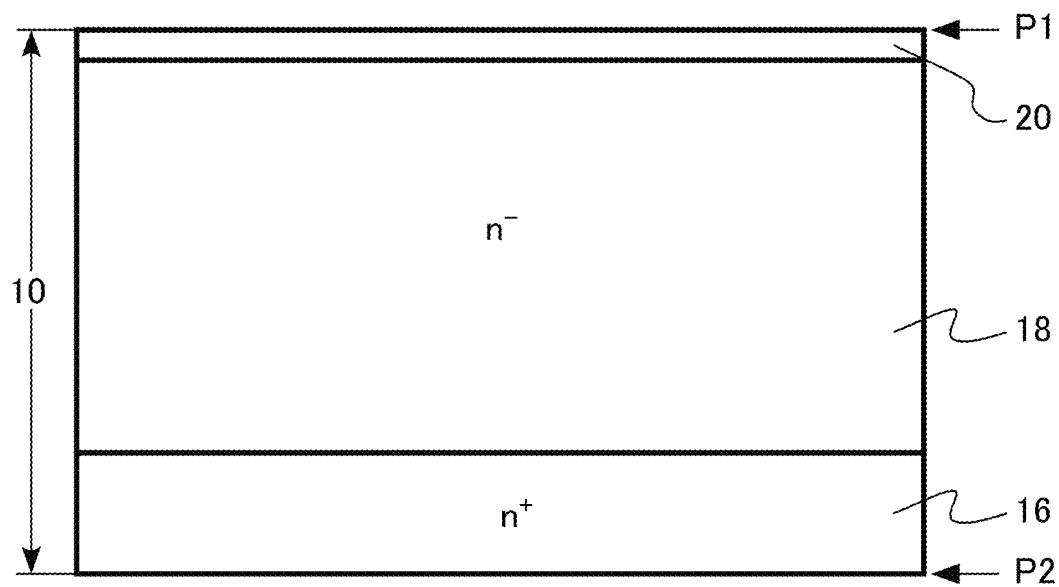
FIG. 8 is a schematic cross-sectional view illustrating the method of manufacturing the semiconductor device according to the first embodiment.

In Step S108, the oxide film 22 is removed (FIG. 8). The oxide film 22 is removed by, for example, wet etching.

Figure 9:
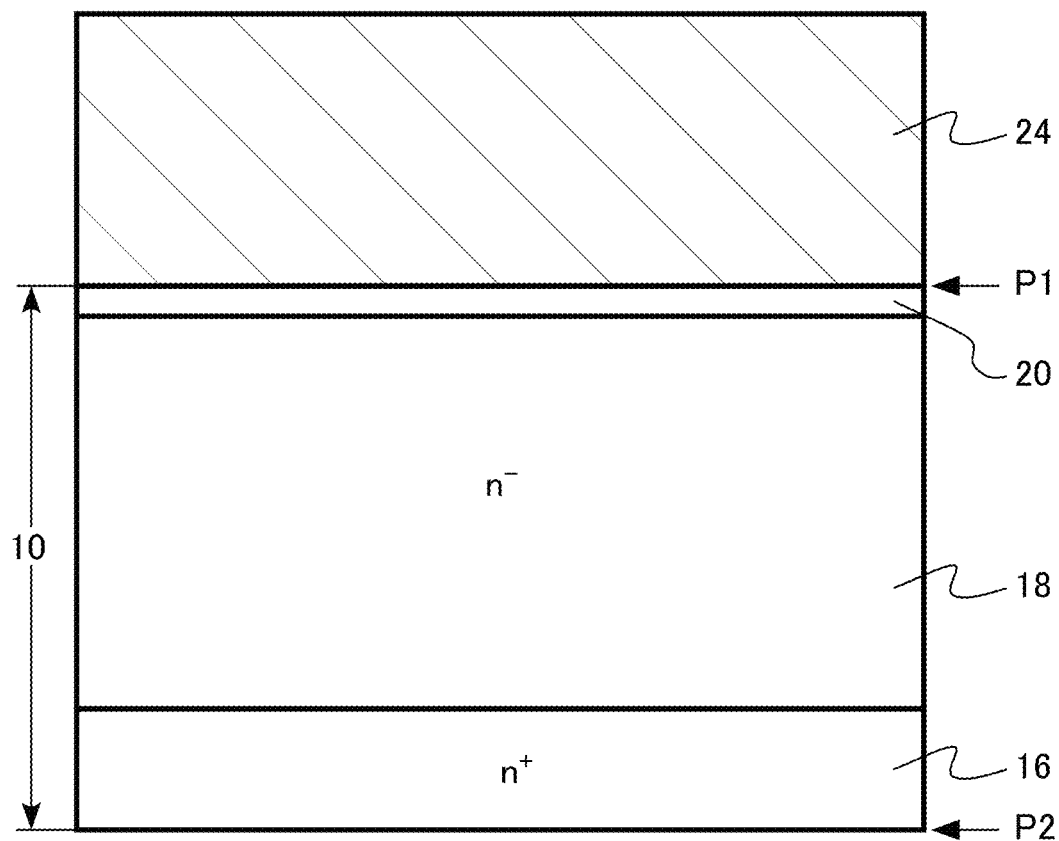
FIG. 9 is a schematic cross-sectional view illustrating the method of manufacturing the semiconductor device according to the first embodiment.

In Step S110, a stacked film 24 of a titanium film and an aluminum film is formed on the silicon carbide layer 10 (FIG. 9). The stacked film 24 is formed by, for example, a sputtering method. The stacked film 24 is an example of the conductive film. The stacked film 24 finally becomes the anode electrode 12.

In Step S112, pile-up annealing is performed. The pile-up annealing is an example of the first heat treatment. By the pile-up annealing, oxygens in the oxygen region 20 are piled up in the interface between the anode electrode 12 and the oxygen region 20.

Pile-up annealing is performed in an atmosphere containing, for example, argon (Ar) or nitrogen (N). The pile-up annealing is performed in an inert gas atmosphere such as argon (Ar) gas.

The temperature of pile-up annealing is lower than, for example, the temperature of diffusion annealing. The temperature of pile-up annealing is, for example, 300° C. or more and 700° C. or less.

In Step S114, a nickel film is formed on the second plane P2 of the silicon carbide layer 10. The nickel film is formed on the back plane of the silicon carbide layer 10. The nickel film is formed, for example, by using a sputtering method. The nickel film finally becomes the cathode electrode 14.

The SBD 100 illustrated in FIG. 1 is manufactured by the above manufacturing method.

Next, functions and effects of the semiconductor device and the method of manufacturing the semiconductor device according to the first embodiment will be described.

In some cases, in a Schottky barrier diode (SBD) using a silicon carbide, the height of the Schottky barrier between the silicon carbide layer and the electrode may vary. If the height of the Schottky barrier between the silicon carbide layer and the electrode varies, a variation in rectification characteristics of the SBD occurs.

For example, if a portion with low Schottky barrier height is locally generated, there is a concern that the portion may cause a variation in on-voltage ($V_F$) during forward bias of the SBD. In addition, if the portion with low Schottky barrier height is locally generated, there is a concern that, for example, an excessive forward current (on-current) may flow in the portion, and the SBD 100 may be destroyed. In addition, if the portion with low Schottky barrier height is locally generated, there is a concern that the breakdown voltage during the reverse bias may be locally reduced. Therefore, it is desired to realize an SBD in which a variation in height of the Schottky barrier is suppressed.

The variation in height of the Schottky barrier is caused by, for example, the variation in the reaction between the silicon carbide layer and the electrode, the variation in the carbon vacancy density of the silicon carbide layer, the variation in the n-type impurity concentration, and the like.

The SBD 100 includes the oxygen region 20 in contact with the anode electrode 12 in the silicon carbide layer 10. The oxygen region 20 contains one oxygen atom bonding with four silicon atoms. The oxygen region 20 is provided in the SBD 100, so that it is possible to suppress a variation in height of the Schottky barrier. The details will be described below.

As a result of the first principle calculation by the inventor, when a carbon vacancy and an oxygen atom coexist in the crystal structure of the silicon carbide, it was clarified that the structure of one oxygen atom filling the carbon vacancy and bonding with four silicon atoms as illustrated in FIG. 2B is stable in terms of energy. That is, it was clarified that the structure in which one oxygen atom is disposed at the carbon site of the crystal structure of the silicon carbide is stable in terms of energy.

Figure 10:
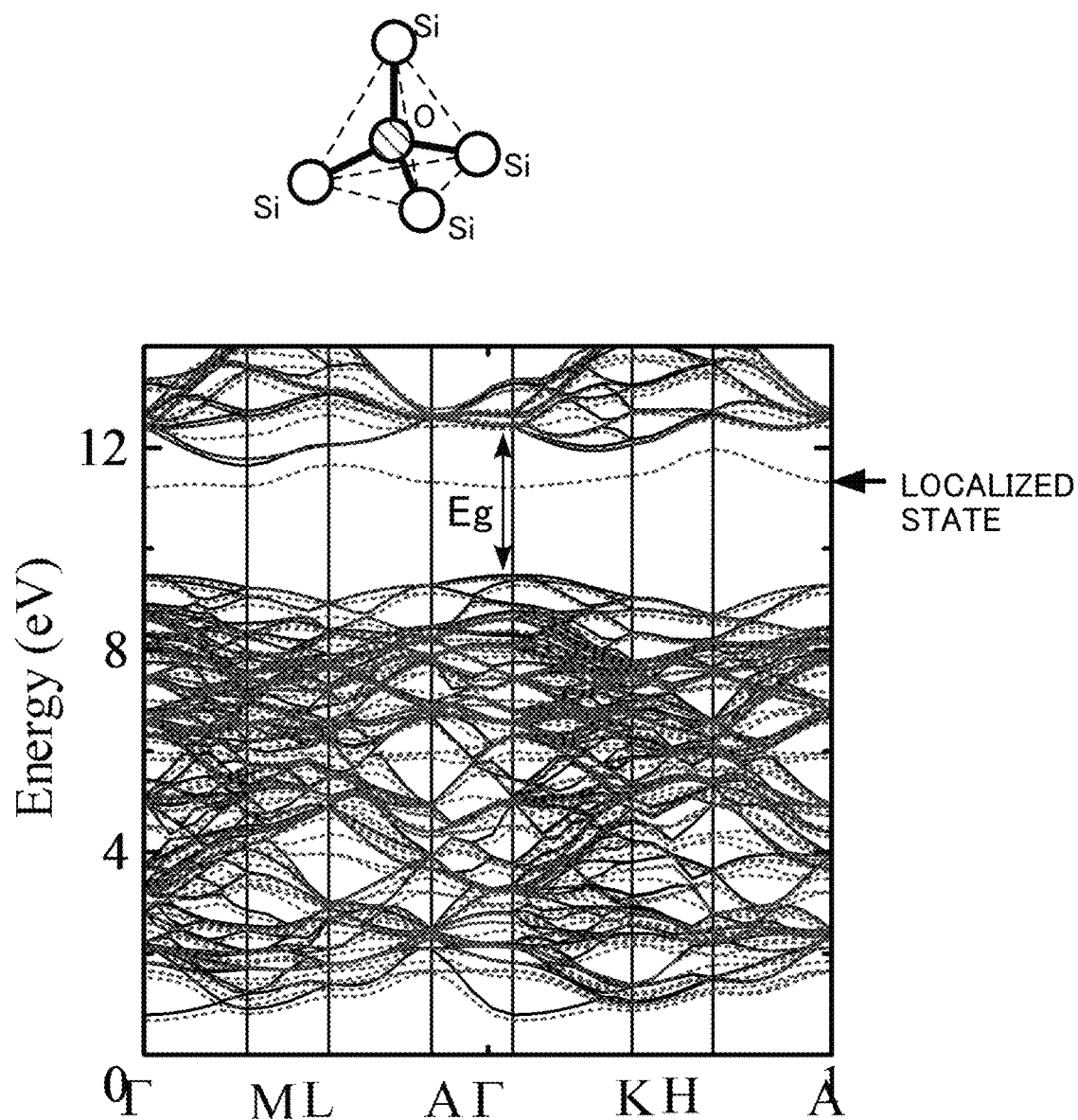
FIG. 10 is an explanatory diagram of functions and effects of the semiconductor device according to the first embodiment.

FIG. 10 is an explanatory diagram of functions and effects of the semiconductor device according to the first embodiment. FIG. 10 is a band diagram in a case where one oxygen atom is disposed at the carbon site of the crystal structure of the silicon carbide. As shown in FIG. 10, a localized state is formed on the lower end side of the conduction band in the band gap (Eg in FIG. 10).

Figure 11:
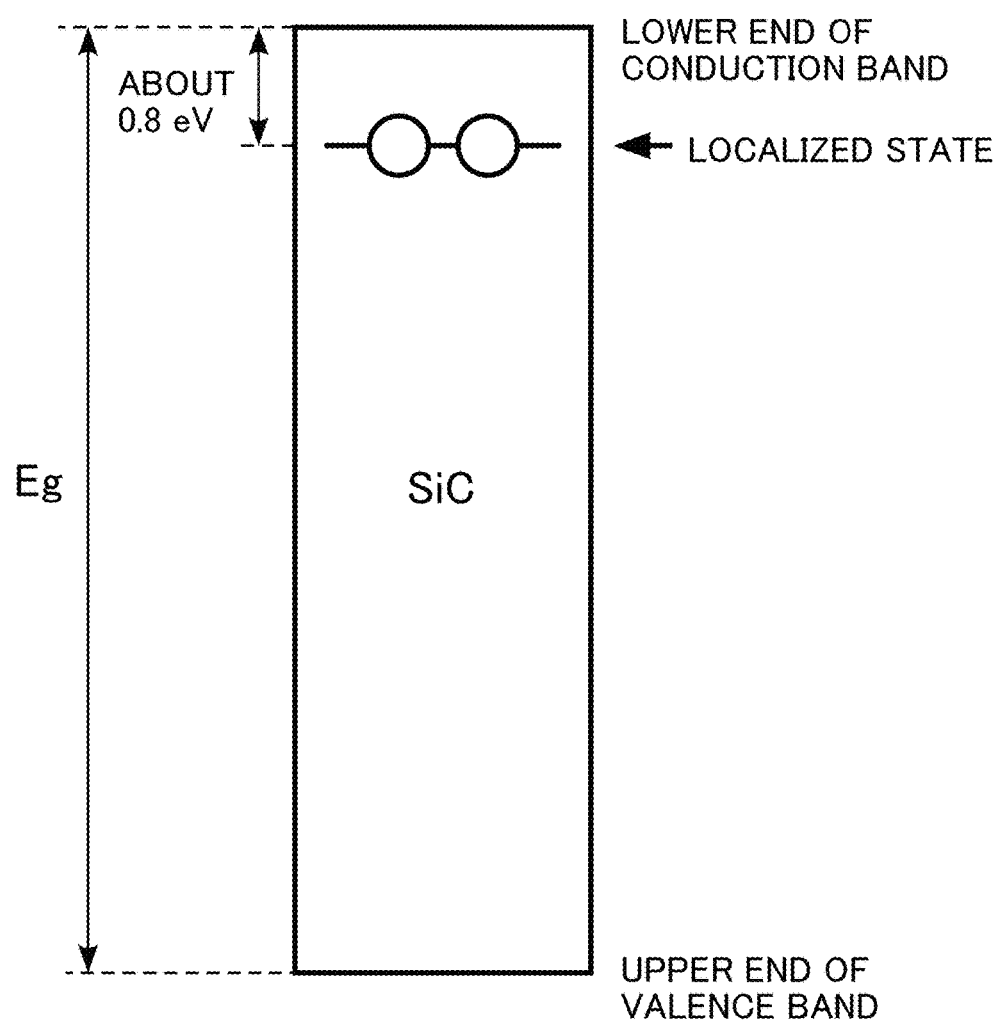
FIG. 11 is an explanatory diagram of functions and effects of the semiconductor device according to the first embodiment.

FIG. 11 is an explanatory diagram of functions and effects of the semiconductor device according to the first embodiment. FIG. 11 is an explanatory diagram of a localized state formed in the band gap.

As illustrated in FIG. 11, the localized state is formed at a position of about 0.8 eV from the lower end of the conduction band. The energy difference between the localized state and the lower end of the conduction band is, for example, 0.7 eV or more and 1.0 eV or less.

When a localized state exists in the oxygen region 20, electrons move between the anode electrode 12 in contact with the oxygen region 20 and the localized state. Due to the movement of electrons, the height of the Schottky barrier between the anode electrode 12 and the oxygen region 20 is fixed to about 0.8 eV. Due to the so-called Fermi-level pinning, the height of the Schottky barrier between the anode electrode 12 and the oxygen region 20 is fixed to about 0.8 eV.

The height of the Schottky barrier is fixed to about 0.8 eV, so that a variation in height of the Schottky barrier of the SBD 100 is suppressed.

In addition, the localized state is formed in the band gap, and the Fermi level pinning occurs, so that the height of the Schottky barrier is fixed to about 0.8 eV regardless of the material of the anode electrode 12. Therefore, the material of the anode electrode 12 can be arbitrarily selected.

From the viewpoint of forming a sufficient amount of localized state in the oxygen region 20 and stably fixing the height of the Schottky barrier, the maximum concentration of oxygen in the oxygen region 20 is preferably $1\times10^{17}$ cm$^{-3}$ or more, more preferably $1\times10^{18}$ cm$^{-3}$ or more, and further preferably $1\times10^{19}$ cm$^{-3}$ or more.

The concentration distribution of oxygen in the anode electrode 12 and the oxygen region 20 has a first peak. The oxygen concentration of the first peak is preferably $1\times10^{17}$ cm$^{-3}$ or more, more preferably $1\times10^{18}$ cm$^{-3}$ or more, and further preferably $1\times10^{19}$ cm$^{-3}$ or more.

From the viewpoint of facilitating the movement of electrons between the localized state and the anode electrode 12, it is preferable that the distance between the interface between the anode electrode 12 and the oxygen region 20 and the first peak is 1 nm or less.

From the viewpoint of forming a sufficient amount of localized state in the oxygen region 20 and stably fixing the height of the Schottky barrier, it is preferable that the ratio of one oxygen atom bonding with four silicon atoms to the oxygen atoms contained in the oxygen region 20 is higher than the ratio of oxygen atoms having other bonded states. The other bonding state is, for example, a state in which oxygen atoms exist between the lattices of the crystal structure of the silicon carbide. In addition, for example, two oxygen atoms exist in pairs at carbon sites in the crystal structure of the silicon carbide. For example, the ratio of one oxygen atom bonding with four silicon atoms to the oxygen atoms contained in the oxygen region 20 is higher than the ratio of oxygen atoms existing between the lattices of the crystal structure of the silicon carbide. In addition, for example, the ratio of one oxygen atom bonding with four silicon atoms to the oxygen atoms contained in the oxygen region 20 is higher than the ratio of oxygen atoms existing in pairs at the carbon site of the crystal structure of the silicon carbide.

In the method of manufacturing the SBD 100 according to the first embodiment, oxygen is introduced into the silicon carbide layer 10 by ion implantation. By the energy of ion implantation, the carbon bond of the silicon carbide layer 10 is broken, and thus, a large amount of carbon vacancies can be formed. By filling a large amount of carbon vacancies with oxygen atoms, it is possible to form a large amount of localized states in the oxygen region 20. In addition, since oxygen is introduced into the silicon carbide layer 10 in the state of atoms (ions) instead of molecules, it becomes easy to fill the carbon vacancy with one oxygen atom.

Figure 12:
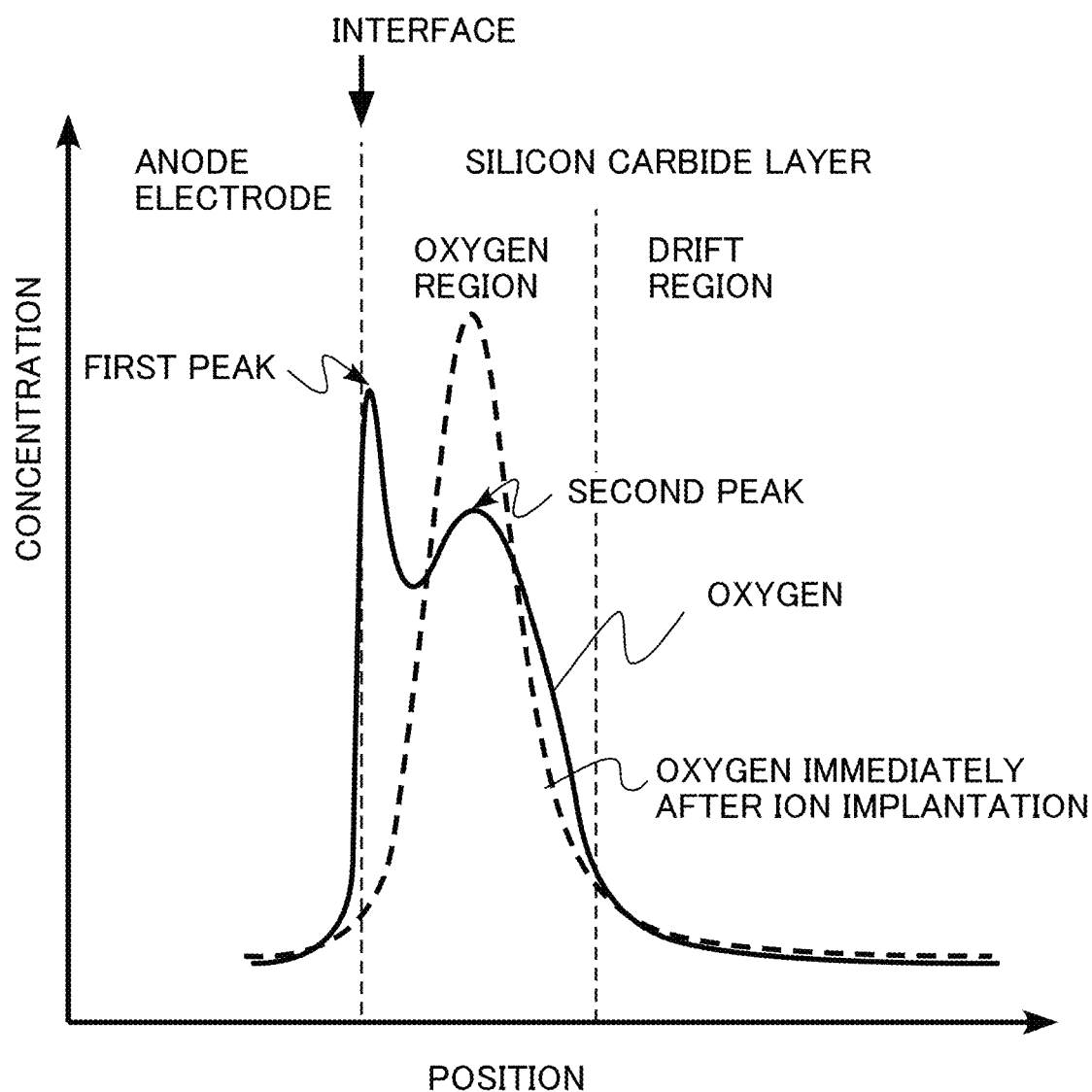
FIG. 12 is an explanatory diagram of functions and effects of the method of manufacturing the semiconductor device according to the first embodiment.

FIG. 12 is an explanatory diagram of functions and effects of the method of manufacturing the semiconductor device according to the first embodiment. FIG. 12 is a diagram showing the concentration distribution of oxygen in the method of manufacturing the semiconductor device according to the first embodiment. FIG. 12 shows the concentration distribution of oxygen in the anode electrode 12 and the silicon carbide layer 10 in the depth direction. FIG. 12 shows the concentration distribution of oxygen in the anode electrode 12, the oxygen region 20, and the drift region 18 in the depth direction.

In FIG. 12, the dashed line curve indicates the concentration distribution of oxygen immediately after the ion implantation of oxygen. In FIG. 12, the solid line curve indicates the concentration distribution of oxygen after the pile-up annealing.

Immediately after the ion implantation, a peak of the concentration distribution of oxygen is formed at a depth position determined by the accelerating voltage of the ion implantation. After that, by performing diffusion annealing before forming the anode electrode 12, oxygen diffuses toward the front plane side and the back plane side of the silicon carbide layer 10.

Then, after the anode electrode 12 is formed, by performing the pile-up annealing, oxygens are piled up in the interface between the anode electrode 12 and the oxygen region 20. This is because the structure in which the carbon vacancy is filled with one oxygen atom becomes more stable in terms of energy as the structure approaches the anode electrode 12. As the structure approaches the anode electrode 12, the electrons in the localized state can easily move to the anode electrode 12, so that the structure in which the carbon vacancy is filled with one oxygen atom becomes more stable in terms of energy.

In the SBD 100 in the first embodiment, the oxygen region 20 is provided, so that a variation in height of the Schottky barrier is suppressed. Therefore, the SBD 100 with stable rectification characteristics can be realized.

In the SBD 100 in the first embodiment, the oxygen region 20 is provided, so that the height of the Schottky barrier is fixed at about 0.8 eV. Therefore, the material of the anode electrode 12 can be arbitrarily selected. Therefore, the degree of freedom in the structural design and the manufacturing process of the SBD 100 is increased.

As described above, according to the first embodiment, it is possible to realize a semiconductor device in which a variation in height of the Schottky barrier is suppressed.

Second Embodiment

A semiconductor device according to a second embodiment is different from the semiconductor device according to the first embodiment in that the silicon carbide layer further includes a pair of third silicon carbide regions of a p-type interposing the second silicon carbide region and being in contact with the first electrode. Hereinafter, a portion of the descriptions of the contents overlapping with the first embodiment will be omitted.

Figure 13:
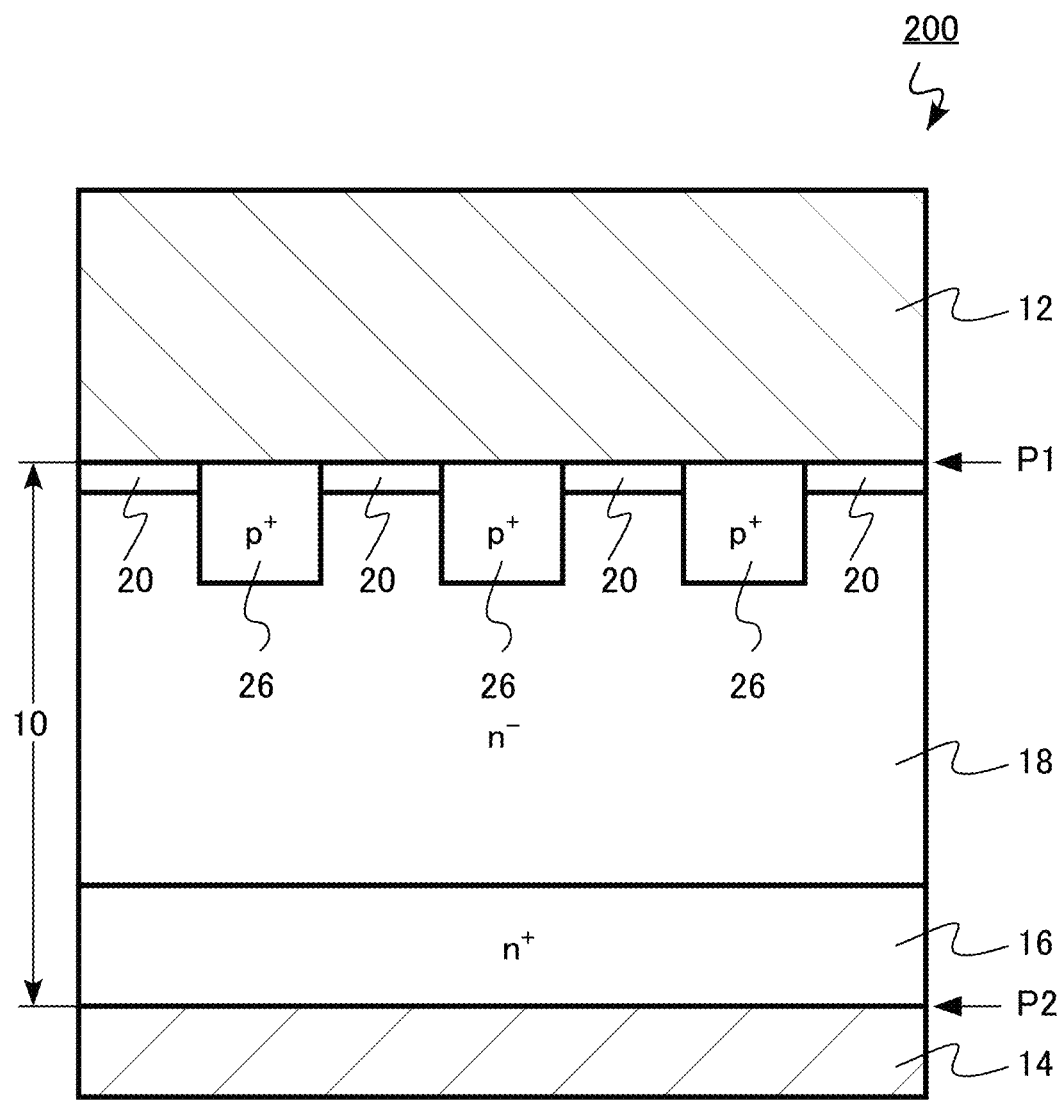
FIG. 13 is a schematic cross-sectional view of a semiconductor device according to a second embodiment.

FIG. 13 is a schematic cross-sectional view of the semiconductor device according to the second embodiment. The semiconductor device according to the second embodiment is a junction barrier Schottky (JBS) diode. The semiconductor device according to the second embodiment is a JBS diode 200. The JBS diode 200 uses electrons as carriers.

The JBS diode 200 includes a silicon carbide layer 10, an anode electrode 12 (first electrode), and a cathode electrode 14 (second electrode).

The anode electrode 12 is an example of the first electrode. The cathode electrode 14 is an example of the second electrode.

The silicon carbide layer 10 includes a cathode region 16, a drift region 18 (first silicon carbide region), an oxygen region 20 (second silicon carbide region), and a plurality of p-type regions 26 (third silicon carbide region).

The plurality of p-type regions 26 are disposed between the drift region 18 and the anode electrode 12. The p-type region 26 is disposed between the drift region 18 and the first plane P1. The p-type region 26 is in contact with the anode electrode 12.

A pair of the p-type regions 26 interpose an oxygen region 20. The depth of the p-type region 26 is, for example, larger than the depth of the oxygen region 20. A pair of the p-type regions 26 interpose the drift region 18 therebetween.

The p-type region 26 contains p-type impurities. The p-type region 26 contains, for example, aluminum (Al) or boron (B) as a p-type impurity. The concentration of p-type impurities in the p-type region 26 is, for example, $1 \times 10^{18}$ cm$^{-3}$ or more and $1 \times 10^{21}$ cm$^{-3}$ or less.

In the JBS diode 200, a depletion layer is connected to the drift region 18 between the p-type regions 26 during the reverse bias. Therefore, the leakage current during the reverse bias is suppressed.

As described above, according to the second embodiment, similarly to the first embodiment, it is possible to realize a semiconductor device in which a variation in height of the Schottky barrier is suppressed. In addition, a semiconductor device in which the leakage current during the reverse bias is suppressed is realized.

Third Embodiment

A semiconductor device according to a third embodiment includes: a first electrode; a second electrode; a silicon carbide layer disposed between the first electrode and the second electrode, the silicon carbide layer including: a first silicon carbide region of an n-type; a second silicon carbide region disposed between the first silicon carbide region and the first electrode, the second silicon carbide region being in contact with the first electrode, and the second silicon carbide region containing one oxygen atom bonding with four silicon atoms; a third silicon carbide region of a p-type disposed between the first silicon carbide region and the first electrode; and a fourth silicon carbide region of an n-type disposed between the third silicon carbide region and the first electrode, the fourth silicon carbide region being in contact with the first electrode, and the fourth silicon carbide region having an n-type impurity concentration higher than an n-type impurity concentration of the first silicon carbide region; a gate electrode disposed on a side of the first electrode of the silicon carbide layer; and a gate insulating layer disposed between the gate electrode and the third silicon carbide region. Hereinafter, a portion of the descriptions of the contents overlapping with the first embodiment will be omitted.

Figure 14:
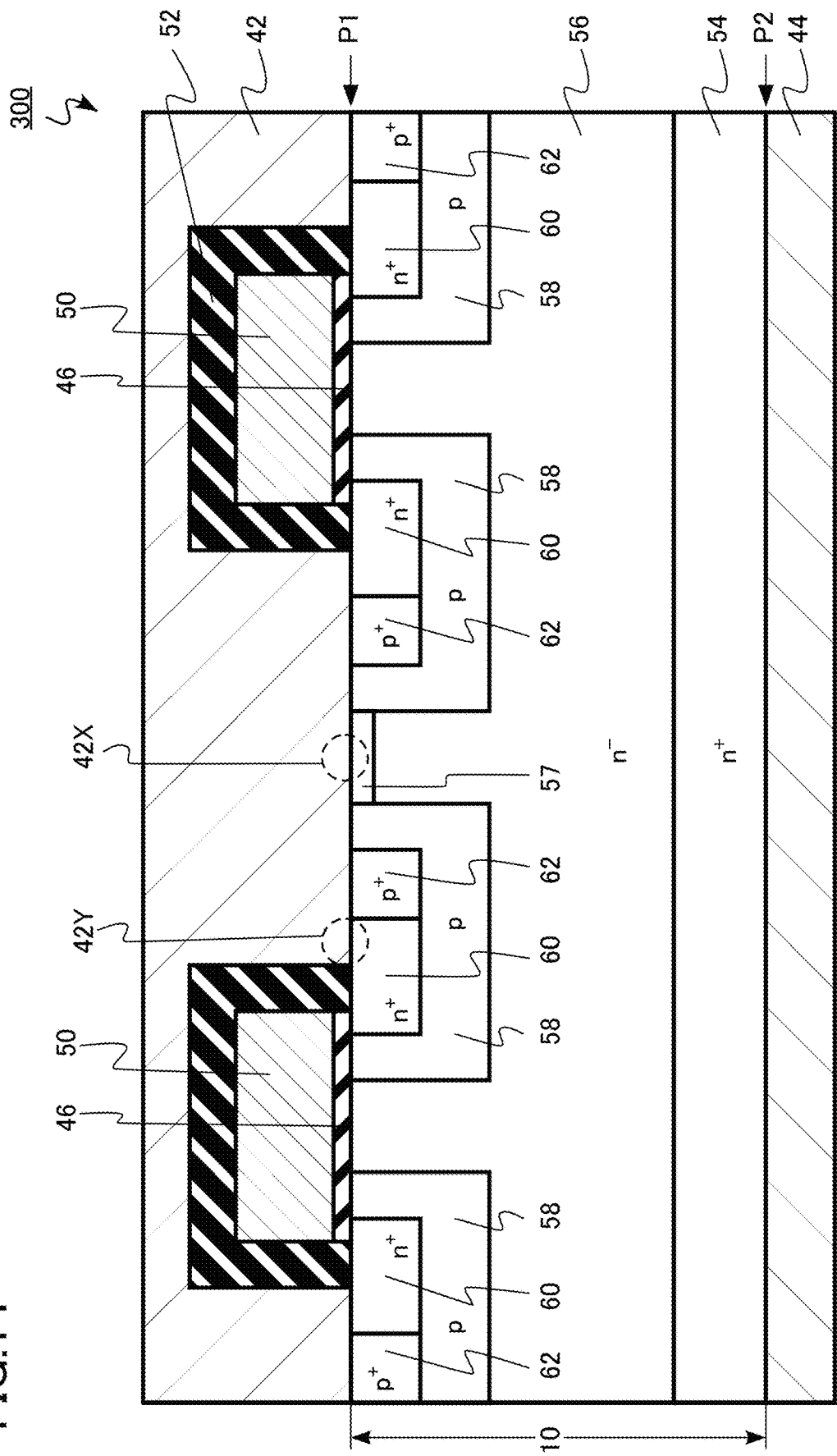
FIG. 14 is a schematic cross-sectional view of a semiconductor device according to a third embodiment.

FIG. 14 is a schematic cross-sectional view of the semiconductor device according to the third embodiment. The semiconductor device according to the third embodiment is a planar gate type vertical MOSFET 300. The MOSFET 300 is an n-channel transistor using electrons as carriers.

The MOSFET 300 includes an SBD as an embedded diode. The SBD, which is an embedded diode, has a structure similar to that of the SBD 100 in the first embodiment.

The MOSFET 300 includes a silicon carbide layer 10, a source electrode 42 (first electrode), a drain electrode 44 (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), an oxygen region 57 (second silicon carbide region), a p-well region 58 (third silicon carbide region), a source region 60 (fourth silicon carbide region), and a p-well contact region 62.

The silicon carbide layer 10 is made of, for example, a single crystal of 4H—SiC. The silicon carbide layer 10 has a first plane P1 and a second plane P2. The second plane P2 faces the first plane P1. The first plane P1 is a front plane of the silicon carbide layer 10, and the second plane P2 is a back plane of the silicon carbide layer 10.

The silicon carbide layer 10 is disposed between the source electrode 42 and the drain electrode 44.

In this specification, a "depth" denotes a distance in a direction from the first plane P1 to the second plane P2 with reference to the first plane P1.

The drain region 54 is made of n$^+$ type SiC. The drain region 54 contains, for example, nitrogen (N) as an n-type impurity. The concentration of n-type impurities in the drain region 54 is, for example, $1 \times 10^{18}$ cm$^{-3}$ or more and $1 \times 10^{21}$ cm$^{-3}$ or less.

The drift region 56 is made of n$^-$ type SiC. The drift region 56 is disposed between the drain region 54 and the source electrode 42. The drift region 56 is disposed between the drain region 54 and the first plane P1. A portion of the drift region 56 is in contact with the first plane P1.

The drift region 56 contains, for example, nitrogen (N) as an n-type impurity. The concentration of n-type impurities in the drift region 56 is, for example, $1 \times 10^{15}$ cm$^{-3}$ or more and $2 \times 10^{16}$ cm$^{-3}$ or less. The concentration of n-type impurities in the drift region 56 is lower than the concentration of n-type impurities in the drain region 54.

The drift region 56 is, for example, an SiC epitaxial growth layer formed on the drain region 54 by epitaxial growth. The thickness of the drift region 56 is, for example, 5 µm or more and 100 µm or less.

The oxygen region 57 is made of n$^-$ type SiC. The oxygen region 57 is disposed between the drift region 18 and the source electrode 42. The oxygen region 57 is disposed between the drift region 18 and the first plane P1. The oxygen region 57 is in contact with the source electrode 42.

The oxygen region 57 contains oxygen as an impurity. The maximum concentration of oxygen in the oxygen region 57 is, for example, $1 \times 10^{17}$ cm$^{-3}$ or more and $1 \times 10^{21}$ cm$^{-3}$ or less.

The oxygen region 57 contains one oxygen atom bonding with four silicon atoms.

The oxygen region 57 contains, for example, nitrogen (N) as an n-type impurity. The concentration of n-type impurities in the oxygen region 57 is, for example, $1 \times 10^{15}$ cm$^{-3}$ or more and $2 \times 10^{16}$ cm$^{-3}$ or less.

The oxygen region 57 is interposed between a pair of the p-well regions 58.

The p-well region 58 is made of p-type SiC. The p-well region 58 is disposed between the drift region 56 and the source electrode 42. The p-well region 58 is disposed between the drift region 56 and the first plane P1. A portion of the p-well region 58 is in contact with the first plane P1.

The p-well region 58 contains, for example, aluminum (Al) as a p-type impurity. The concentration of p-type impurities in the p-well region 58 is, for example, $1 \times 10^{16}$ cm$^{-3}$ or more and $1 \times 10^{20}$ cm$^{-3}$ or less.

The depth of the p-well region 58 is, for example, 0.4 µm or more and 0.8 µm or less. The p-well region 58 functions as a channel region of the MOSFET 300.

The source region 60 is made of n$^+$ type SiC. The source region 60 is disposed between the p-well region 58 and the source electrode 42. The source region 60 is disposed between the p-well region 58 and the first plane P1. A portion of the source region 60 is in contact with the first plane P1.

The source region 60 contains phosphorus (P) or nitrogen (N) as an n-type impurity. The concentration of n-type impurities in the source region 60 is, for example, $1 \times 10^{18}$ cm$^{-3}$ or more and $1 \times 10^{22}$ cm$^{-3}$ or less. The concentration of n-type impurities in the source region 60 is higher than the concentration of n-type impurities in the drift region 56.

The depth of the source region 60 is smaller than the depth of the p-well region 58. The depth of the source region 60 is, for example, 0.1 µm or more and 0.4 µm or less.

The p-well contact region 62 is made of p$^+$ type SiC. The p-well contact region 62 is disposed between the p-well region 58 and the source electrode 42. The p-well contact region 62 is disposed between the p-well region 58 and the first plane P1. The p-well contact region 62 is adjacent to the source region 60.

The p-well contact region 62 contains, for example, aluminum as a p-type impurity. The concentration of p-type impurities in the p-well contact region 62 is, for example, $1 \times 10^{18}$ cm$^{-3}$ or more and $1 \times 10^{22}$ cm$^{-3}$ or less. The concentration of p-type impurities in the p-well contact region 62 is higher than the concentration of p-type impurities in the p-well region 58.

The depth of the p-well contact region 62 is smaller than the depth of the p-well region 58. The depth of the p-well contact region 62 is, for example, 0.1 µm or more and 0.4 µm or less.

The gate insulating layer 46 is disposed between the silicon carbide layer 10 and the gate electrode 50. The gate insulating layer 46 is disposed between the p-well region 58 and the gate electrode 50.

The gate insulating layer 46 is made of, for example, an oxide or an oxynitride. The gate insulating layer 46 is made of, for example, a silicon oxide. The thickness of the gate insulating layer 46 is, for example, 30 nm or more and 200 nm or less.

The gate insulating layer 46 and the p-well region 58 are in contact with each other. The p-well region 58 near the gate insulating layer 46 becomes the channel region of the MOSFET 300.

The gate electrode 50 is disposed on the first plane P1 side of the silicon carbide layer 10. The gate electrode 50 is provided on the gate insulating layer 46. The gate electrode 50 interposes the gate insulating layer 46 between the drift region 56, the source region 60, and the p-well region 58.

The gate electrode 50 is made of a conductor. The gate electrode 50 is made of, for example, polycrystalline silicon containing n-type impurities or p-type impurities. The gate electrode 50 may be made of, for example, a metal such as a titanium nitride, a tungsten nitride, tungsten, aluminum, copper, ruthenium, cobalt, nickel, a cobalt silicide, or a nickel silicide. The gate electrode 50 may have a stacked structure of any one of the above-mentioned metals and polycrystalline silicon containing n-type impurities or p-type impurities.

The interlayer insulating layer 52 is formed on the gate electrode 50. The interlayer insulating layer 52 electrically separates the gate electrode 50 and the source electrode 42. The interlayer insulating layer 52 is made of, for example, a silicon oxide.

The source electrode 42 is disposed on the first plane P1 side of the silicon carbide layer 10. The source electrode 42 is electrically connected to the oxygen region 57, the source region 60, and the p-well contact region 62. The source electrode 42 is in contact with the oxygen region 57, the source region 60, and the p-well contact region 62. The source electrode 42 also functions as a p-well electrode that applies an electric potential to the p-well region 58.

An ohmic contact exists between the source electrode 42 and the source region 60. An ohmic contact exists between the source electrode 42 and the p-well contact region 62.

A Schottky contact exists between the source electrode 42 and the oxygen region 57. The height of the Schottky barrier between the source electrode 42 and the oxygen region 57 is, for example, 0.7 eV or more and 1.0 eV or less. The height of the Schottky barrier between the source electrode 42 and the oxygen region 57 is, for example, about 0.8 eV.

The source electrode 42 is made of a conductor. The source electrode 42 is made of, for example, a metal, an intermetallic compound, a metal nitride, a metal silicide, or a semiconductor.

The source electrode 42 may have, for example, a stacked structure. The source electrode 42 has, for example, a stacked structure of two different types of metals. The source electrode 42 has, for example, a stacked structure of a metal silicide and a metal.

The source electrode 42 has, for example, a stacked structure of titanium and aluminum. The source electrode 42 contains, for example, a nickel silicide. The source electrode 42 has, for example, a stacked structure of a nickel silicide and aluminum.

The source electrode 42 has a first portion 42X and a second portion 42Y. The first portion 42X is in contact with the oxygen region 57. The second portion 42Y is in contact with the source region 60. The first portion 42X and the second portion 42Y are made of, for example, the same material. The first portion 42X and the second portion 42Y have, for example, the same chemical composition.

The drain electrode 44 is disposed on the second plane P2 side of the silicon carbide layer 10. The drain electrode 44 is in contact with the drain region 54. The drain electrode 44 is electrically connected to the drain region 54.

The drain electrode 44 is made of a conductor. The drain electrode 44 is made of, for example, a metal, an intermetallic compound, a metal nitride, a metal silicide, or a semiconductor.

The drain electrode 44 is made of, for example, nickel. The nickel may react with the silicon carbide layer 10 to form the nickel silicide. The nickel silicide is, for example, NiSi and $Ni_2Si$.

Hereinafter, functions and effects of the semiconductor device according to the third embodiment will be described.

Figure 15:
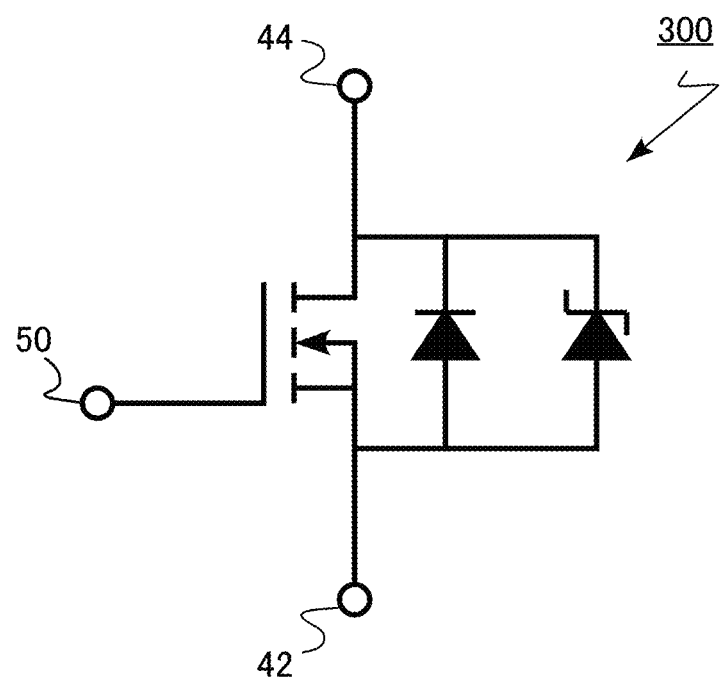
FIG. 15 is an equivalent circuit diagram of the semiconductor device according to the third embodiment.

FIG. 15 is an equivalent circuit diagram of the semiconductor device according to the third embodiment. A pn diode and an SBD are connected as embedded diodes in parallel with a transistor having the gate electrode 50 between the source electrode 42 and the drain electrode 44. The source electrode 42 is the anode of the pn junction diode, and the drain electrode 44 is the cathode of the pn junction diode. In addition, the source electrode 42 is the anode of the SBD, and the drain electrode 44 is the cathode of the SBD.

The source electrode 42, the oxygen region 57, the drift region 56, the drain region 54, and the drain electrode 44 constitute the SBD.

For example, a case where the MOSFET 300 is used as a switching element connected to an inductive load is considered. In some cases, when the MOSFET 300 is powered off, due to the load current caused by the inductive load, a voltage that allows the source electrode 42 to be positive may be applied to the drain electrode 44. In this case, a forward current flows through the embedded diode. This state is also called a reverse conduction state.

A forward voltage (Vf) at which the forward current begins to flow in the SBD is lower than a forward voltage (Vf) of the pn junction diode. Therefore, first, the forward current flows through the SBD.

The forward voltage (Vf) of the SBD is, for example, 0.8 V. The forward voltage (Vf) of the pn junction diode is, for example, 2.5 V.

The SBD performs unipolar operations. For this reason, even if a forward current flows, stacking defects do not grow in the silicon carbide layer 10 due to the recombination energy of the carriers. Therefore, the fluctuation in on-resistance caused by the growth of stacking defects does not occur.

In addition, the SBD of the MOSFET 300 includes the oxygen region 57. Therefore, similarly to the SBD 100 according to the first embodiment, a variation in height of the Schottky barrier is suppressed. Therefore, the SBD with stable rectification characteristics is realized.

In addition, in the MOSFET 300, in order to reduce the on-resistance, it is preferable that there are an ohmic contact and a low contact resistance between the second portion 42Y of the source electrode 42 and the source region 60. On the other hand, in order to realize the rectifying operation of the SBD, it is necessary to have a Schottky contact between the first portion 42X of the source electrode 42 and the oxygen region 57.

The oxygen region 57 is provided in the MOSFET 300, so that the Schottky contact is formed between the first portion 42X and the oxygen region 57 regardless of the material of the first portion 42X. Therefore, the optimum material for the source electrode 42 can be selected so that an ohmic contact or a low contact resistance is formed between the second portion 42Y and the source region 60.

That is, the first portion 42X and the second portion 42Y can be made of the same material. Therefore, it is not necessary to adopt a complicated device structure such as employing different materials to, for example, the first portion 42X and the second portion 42Y. In addition, since the first portion 42X and the second portion 42Y can be made of the same material, the manufacturing process is simplified. Therefore, it is possible to realize a MOSFET including an SBD, which has a simple device structure and a simple manufacturing process.

Modified Example 1

A semiconductor device according to Modified Example 1 of the third embodiment is different from the semiconductor device according to the third embodiment in that the silicon carbide layer includes a current diffusion region.

Figure 16:
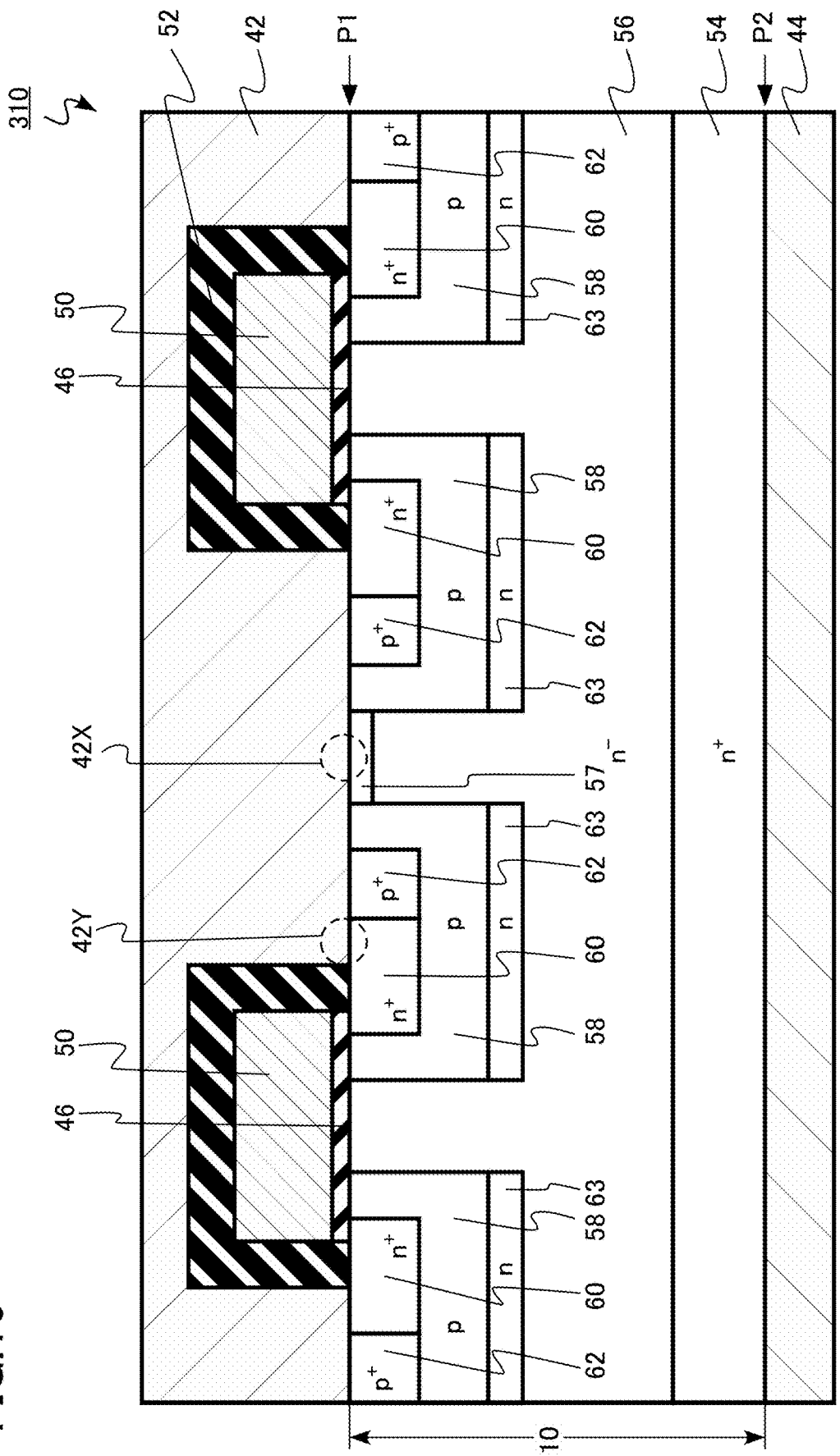
FIG. 16 is a schematic cross-sectional view of a semiconductor device according to Modified Example 1 of the third embodiment.

FIG. 16 is a schematic cross-sectional view of the semiconductor device according to Modified Example 1 of the third embodiment. The semiconductor device according to Modified Example 1 of the third embodiment is a planar gate type vertical MOSFET 310.

The silicon carbide layer 10 of the MOSFET 310 includes a current diffusion region 63.

The current diffusion region 63 is made of n-type SiC. The current diffusion region 63 is disposed between the drift region 56 and the p-well region 58.

The current diffusion region 63 contains, for example, nitrogen (N) as an n-type impurity. The concentration of n-type impurities in the current diffusion region 63 is, for example, $2 \times 10^{15}$ cm$^{-3}$ or more and $5 \times 10^{16}$ cm$^{-3}$ or less. The concentration of n-type impurities in the current diffusion region 63 is higher than the concentration of n-type impurities in the drift region 56.

The current diffusion region 63 is provided, so that the MOSFET 310 has a reduced on-resistance as compared with the MOSFET 300. In other words, as compared with the MOSFET 300, the on-current of the MOSFET 310 increases. In addition, as compared with the MOSFET 300, the forward current of the SBD embedded in the MOSFET 310 also increases.

Modified Example 2

A semiconductor device according to Modified Example 2 of the third embodiment is different from the semiconductor device according to the third embodiment in that the side surface includes a silicide layer in contact with the fourth silicon carbide region.

Figure 17:
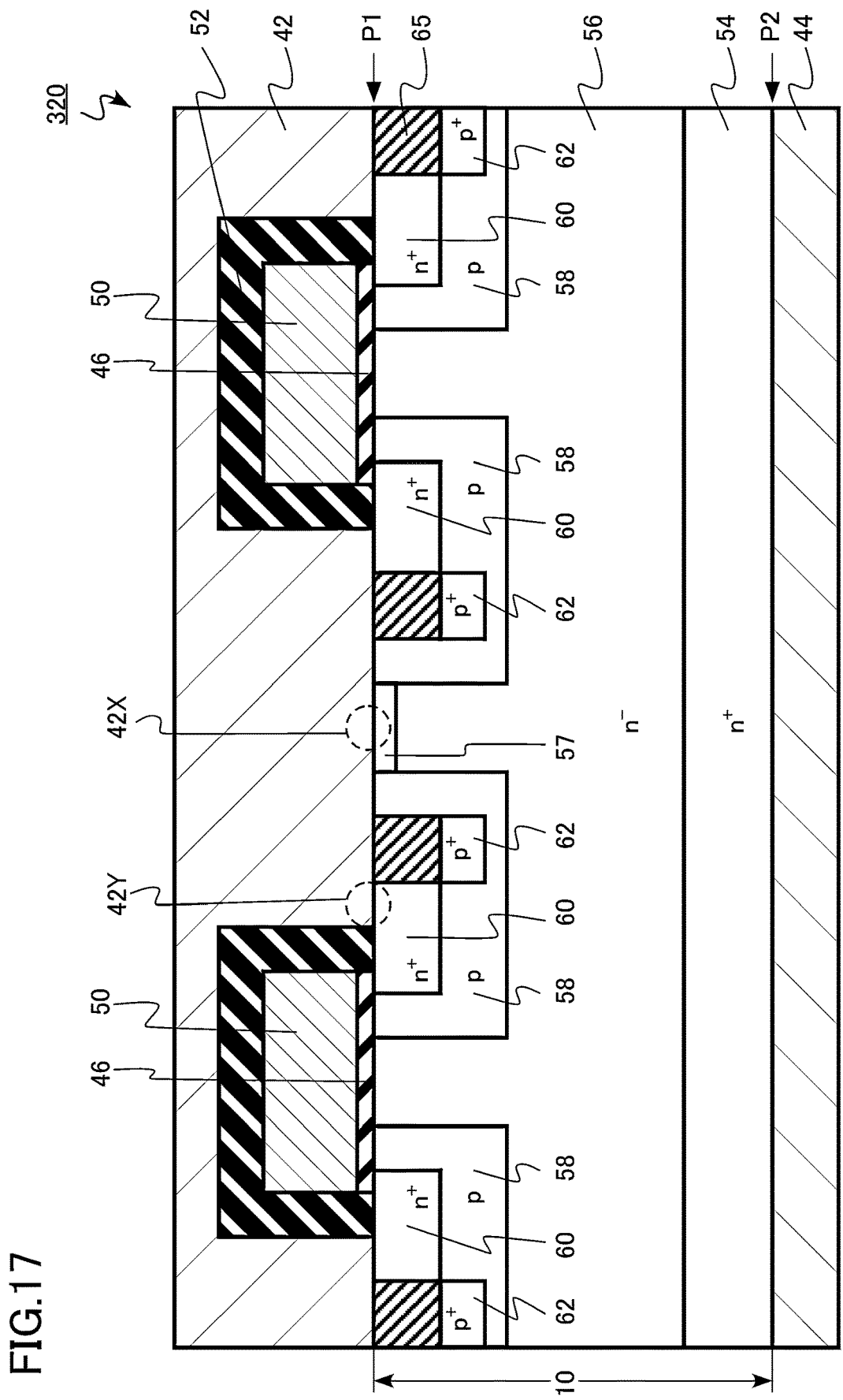
FIG. 17 is a schematic cross-sectional view of a semiconductor device according to Modified Example 2 of the third embodiment.

FIG. 17 is a schematic cross-sectional view of the semiconductor device according to Modified Example 2 of the third embodiment. The semiconductor device according to Modified Example 2 of the third embodiment is a planar gate type vertical MOSFET 320.

The MOSFET 320 includes a silicide layer 65.

The p-well contact region 62 is deeper than the source region 60.

The silicide layer 65 is provided between the source electrode 42 and the p-well contact region 62. The side surface of the silicide layer 65 is in contact with the source region 60.

The silicide layer 65 is in contact with the source electrode 42. The silicide layer 65 can also be regarded as a portion of the source electrode 42. The silicide layer 65 is made of, for example, a nickel silicide.

The MOSFET 320 includes the silicide layer 65, so that the electrical resistance between the source electrode 42 and the source region 60 is reduced. Therefore, as compared with the MOSFET 300, the on-resistance of the MOSFET 320 is reduced. In other words, as compared with the MOSFET 300, the on-current of the MOSFET 320 increases.

As described above, according to the third embodiment and Modified Example thereof, it is possible to realize a semiconductor device in which a variation in height of the Schottky barrier is suppressed. In addition, it is possible to realize a semiconductor device having a simple device structure and a simple manufacturing process.

Fourth Embodiment

A semiconductor device according to a fourth embodiment is different from the semiconductor device according to the third embodiment in that the third silicon carbide region is in contact with the second silicon carbide region. Hereinafter, a portion of the descriptions of the contents overlapping with the third embodiment will be omitted.

Figure 18:
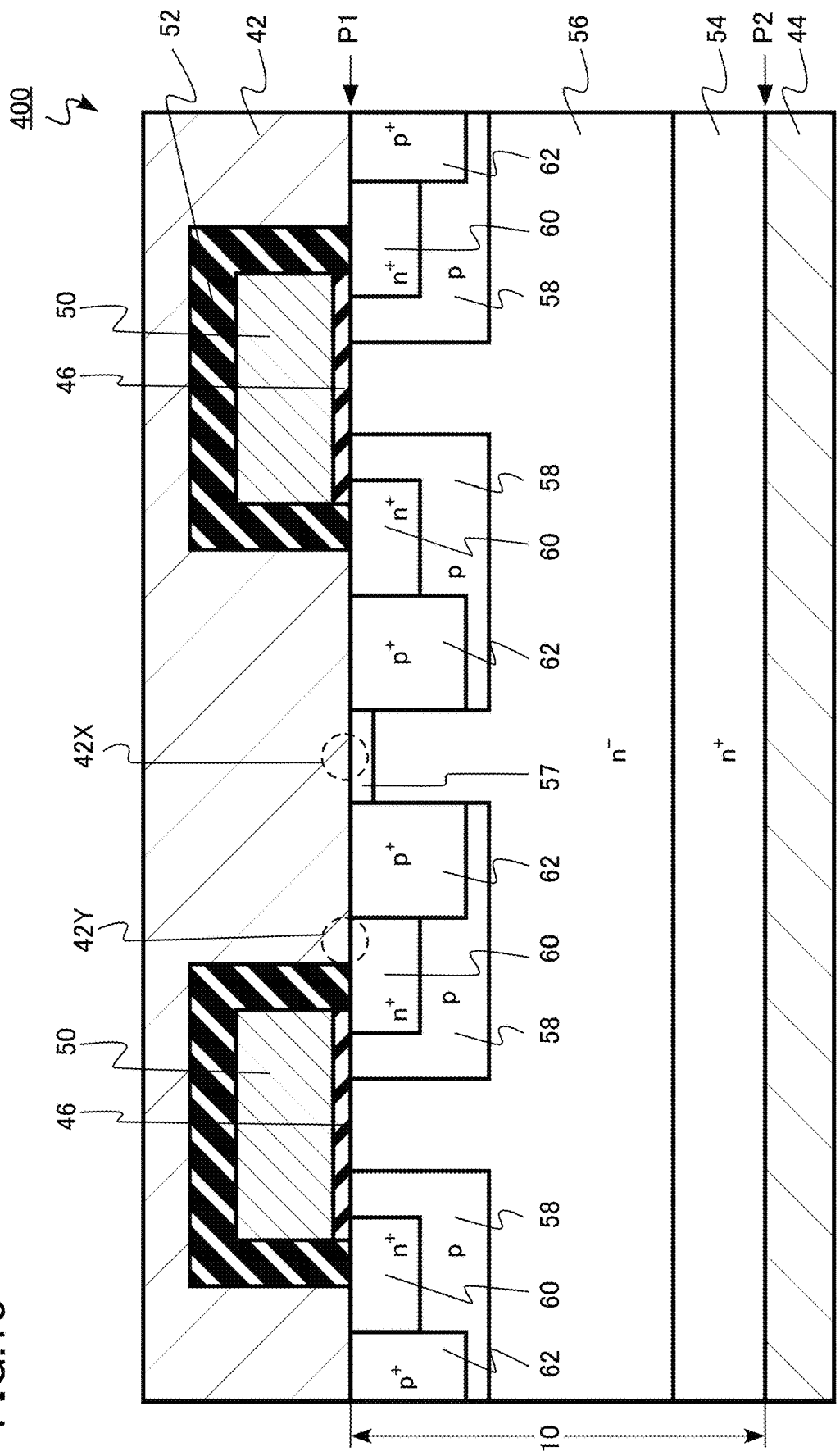
FIG. 18 is a schematic cross-sectional view of the semiconductor device according to a fourth embodiment.
Figure 19:
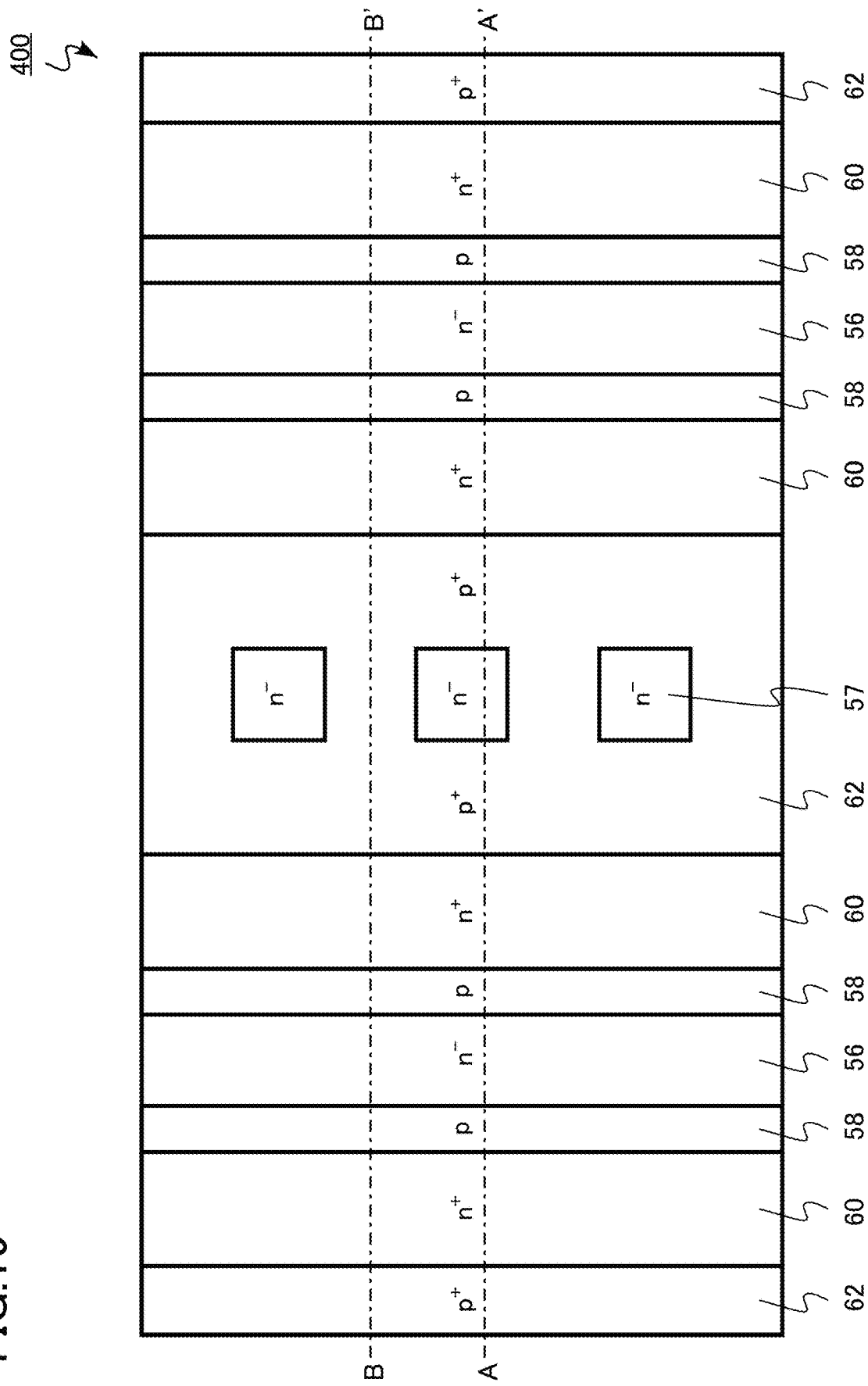
FIG. 19 is a schematic top view of the semiconductor device according to the fourth embodiment.
Figure 20:
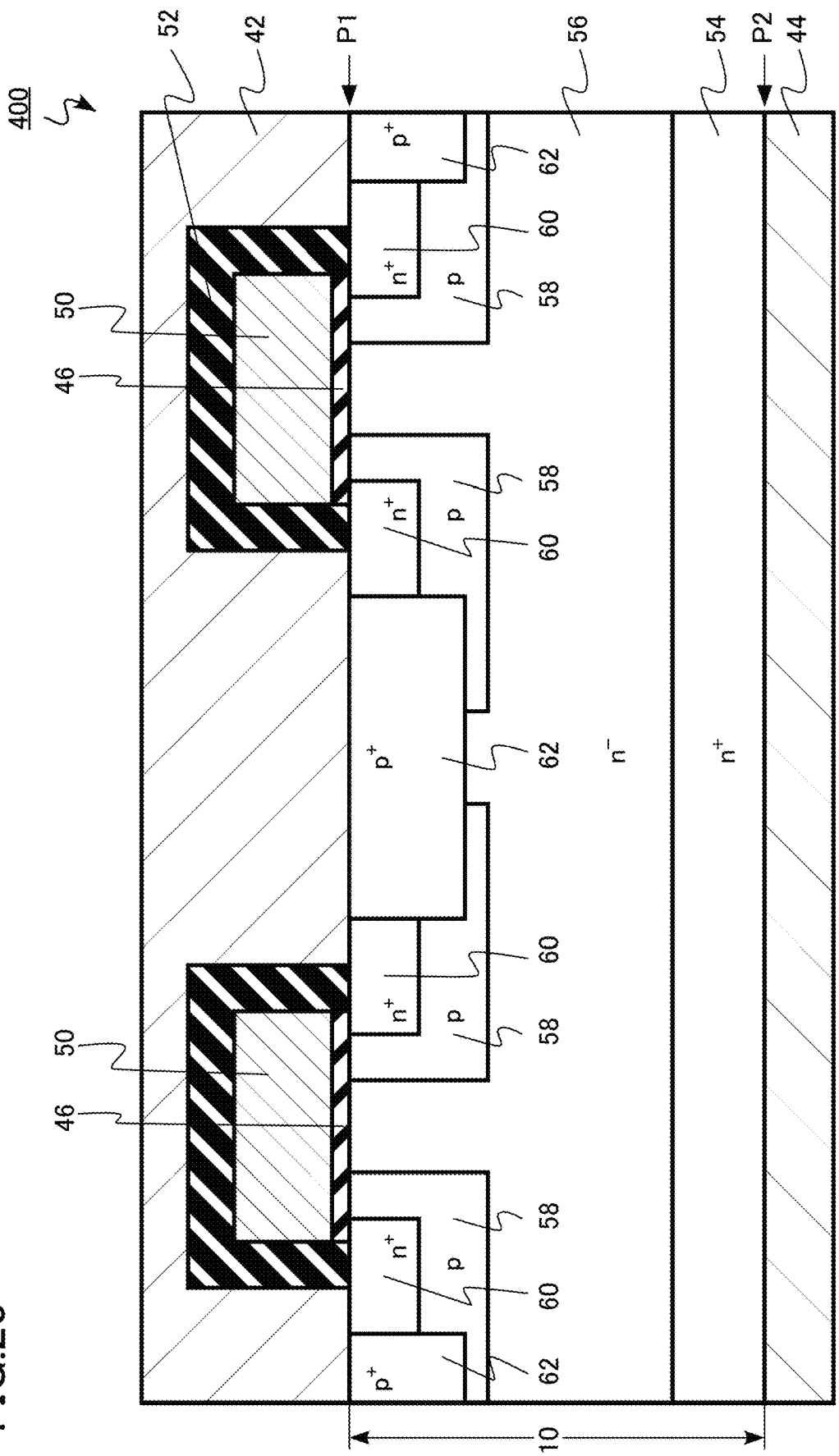
FIG. 20 is a schematic cross-sectional view of the semiconductor device according to the fourth embodiment.

FIG. 18 is a schematic cross-sectional view of the semiconductor device according to the fourth embodiment. FIG. 19 is a schematic top view of the semiconductor device according to the fourth embodiment. FIG. 20 is a schematic cross-sectional view of the semiconductor device according to the fourth embodiment. FIG. 18 illustrates a cross section taken along line AA' of FIG. 19. FIG. 20 illustrates a cross section taken along line BB' of FIG. 19.

The semiconductor device according to the fourth embodiment is a planar gate type vertical MOSFET 400. The MOSFET 400 is an n-channel transistor using electrons as carriers.

The MOSFET 400 includes an SBD as an embedded diode. The SBD, which is an embedded diode, has a structure similar to that of the SBD 100 in the first embodiment. In addition, the embedded diode is a merged PiN Schottky (MPS) diode.

The MOSFET 400 includes a silicon carbide layer 10, a source electrode 42 (first electrode), a drain electrode 44 (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), an oxygen region 57 (second silicon carbide region), a p-well region 58 (third silicon carbide region), a source region 60 (fourth silicon carbide region), and a p-well contact region 62.

The oxygen region 57 is made of n$^-$ type SiC. The oxygen region 57 is disposed between the drift region 18 and the source electrode 42. The oxygen region 57 is disposed between the drift region 18 and the first plane P1. The oxygen region 57 is in contact with the source electrode 42.

The oxygen region 57 is surrounded by the p-well contact region 62. The oxygen region 57 is in contact with the p-well contact region 62.

The p-well contact region 62 is made of p$^+$ type SiC. The p-well contact region 62 is disposed between the p-well region 58 and the source electrode 42. The p-well contact region 62 is disposed between the p-well region 58 and the first plane P1. The p-well contact region 62 is adjacent to the source region 60.

The p-well contact region 62 surrounds the oxygen region 57.

FIGS. 21A, 21B, 21C, 21D, and 21E are top views of the fourth embodiment and the modified examples thereof. FIGS. 21A, 21B, 21C, 21D, and 21E illustrate layout patterns of the oxygen region 57 and the p-well contact region 62 in the fourth embodiment and the modified examples thereof.

Figure 21A:
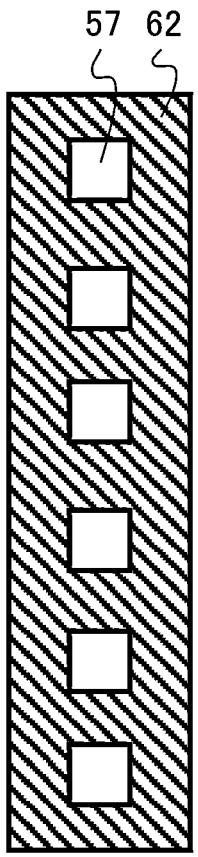
FIGS. 21A, 21B, 21C, 21D, and 21E are top views according to the fourth embodiment and a modified example.
Figure 21B:
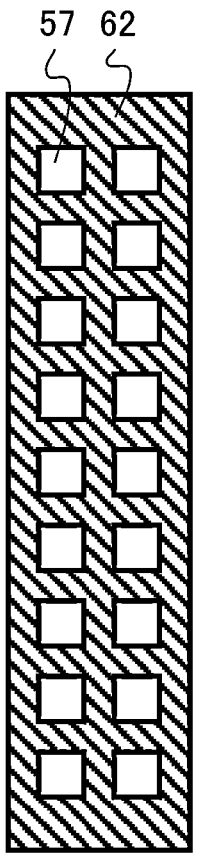
Figure 21C:
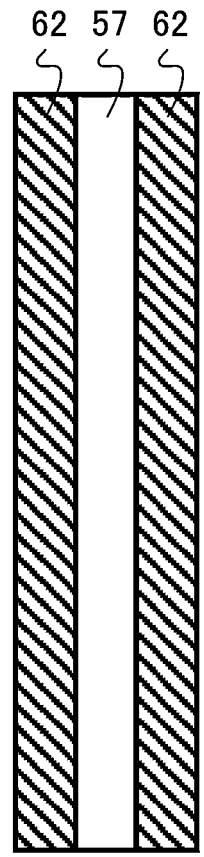
Figure 21D:
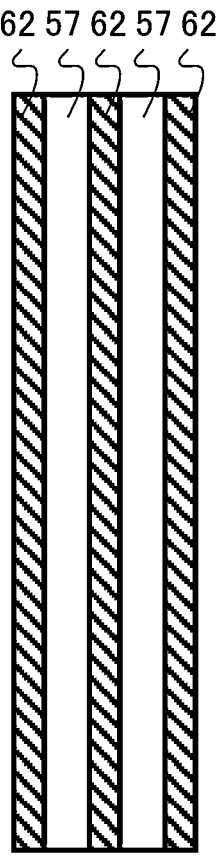
Figure 21E:
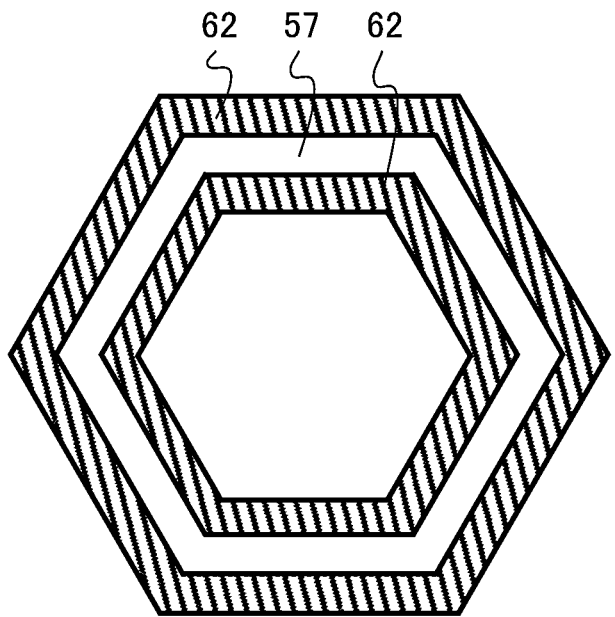

FIG. 21A is a top view of the fourth embodiment, FIG. 21B is a top view of Modified Example 1, FIG. 21C is a top view of Modified Example 2, FIG. 21D is a top view of Modified Example 3, and FIG. 21E is a top view of Modified Example 4.

The layout pattern of the oxygen region 57 and the p-well contact region 62 may have a grid pattern as illustrated in FIG. 21B. In addition, the layout pattern of the oxygen region 57 and the p-well contact region 62 may have a stripe shape as illustrated in FIGS. 21C and 21D. In addition, as illustrated in FIG. 21E, the layout pattern may have a hexagonal shape.

As described above, according to the fourth embodiment, it is possible to realize a semiconductor device in which a variation in height of the Schottky barrier is suppressed. In addition, it is possible to realize a semiconductor device having a simple device structure and a simple manufacturing process.

Fifth Embodiment

A semiconductor device according to a fifth embodiment is different from the semiconductor device according to the fourth embodiment in that the interface between the second silicon carbide region and the first electrode is closer to the second plane. Hereinafter, a portion of the descriptions of the contents overlapping with the fourth embodiment will be omitted.

Figure 22:
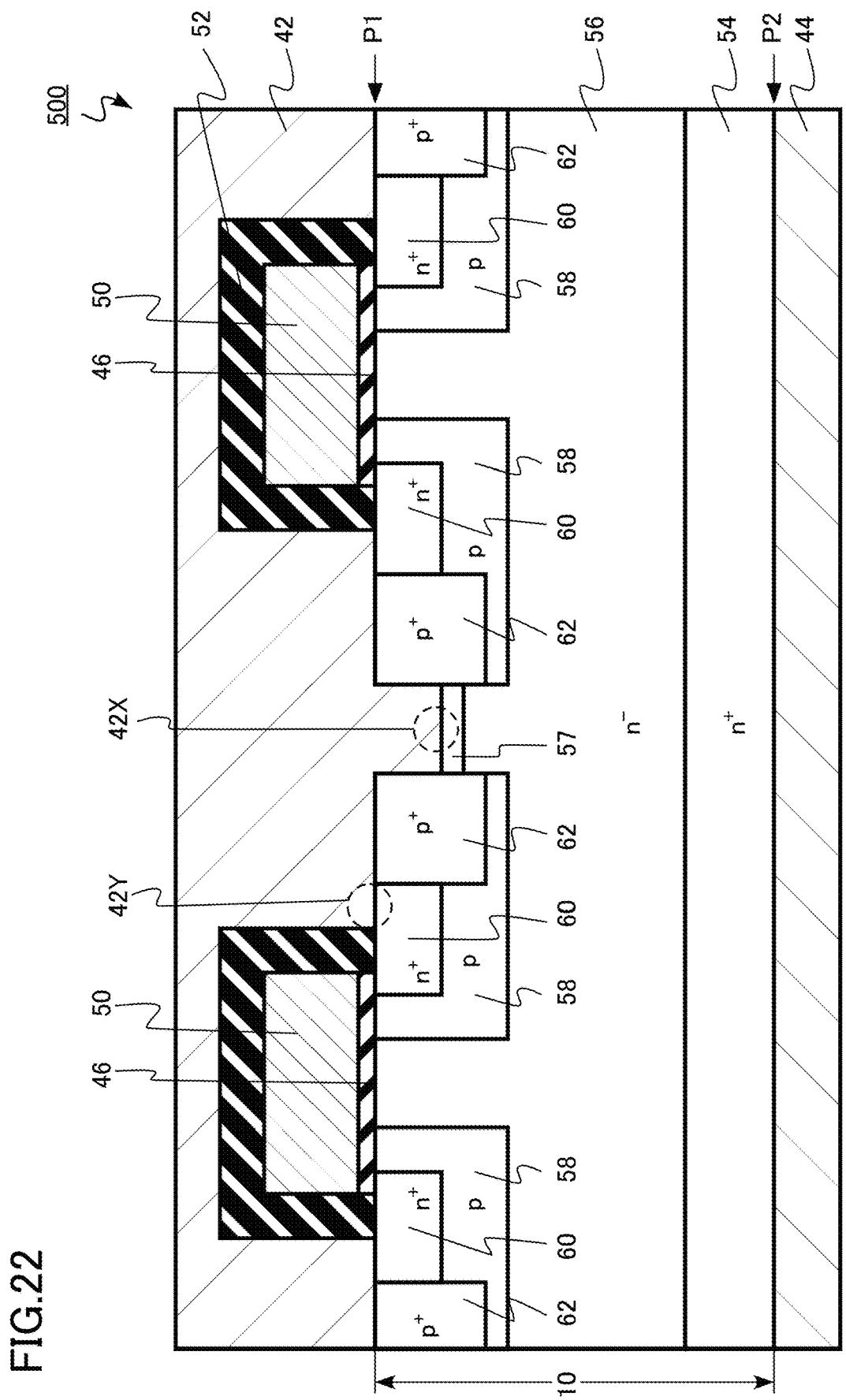
FIG. 22 is a schematic cross-sectional view of a semiconductor device according to a fifth embodiment.

FIG. 22 is a schematic cross-sectional view of the semiconductor device according to the fifth embodiment. FIG. 22 is a diagram corresponding to FIG. 18 of the fourth embodiment.

The semiconductor device according to the fifth embodiment is a planar gate type vertical MOSFET 500. The MOSFET 500 is an n-channel transistor using electrons as carriers.

The MOSFET 500 includes an SBD as an embedded diode. The SBD, which is an embedded diode, has a structure similar to that of the SBD 100 in the first embodiment. In addition, the embedded diode is an MPS diode.

The MOSFET 500 includes a silicon carbide layer 10, a source electrode 42 (first electrode), a drain electrode 44 (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), an oxygen region 57 (second silicon carbide region), a p-well region 58 (third silicon carbide region), a source region 60 (fourth silicon carbide region), and a p-well contact region 62.

The oxygen region 57 is made of n⁻ type SiC. The oxygen region 57 is disposed between the drift region 18 and the source electrode 42. The oxygen region 57 is disposed between the drift region 18 and the first plane P1. The oxygen region 57 is in contact with the source electrode 42.

The oxygen region 57 is surrounded by the p-well contact region 62. The oxygen region 57 is in contact with the p-well contact region 62.

The interface between the oxygen region 57 and the source electrode 42 is closer to the second plane P2 compared with the MOSFET 400 of the second embodiment. The interface between the oxygen region 57 and the source electrode 42 is closer to the second plane P2 compared with an interface between p-well contact region 62 and the source electrode 42. For example, a portion of the source electrode 42 is filled in a groove provided in the silicon carbide layer 10.

Modified Example

A semiconductor device according to Modified Example of the fifth embodiment is different from the semiconductor device according to the fifth embodiment in that the pattern of the fourth silicon carbide region is different.

Figure 23:
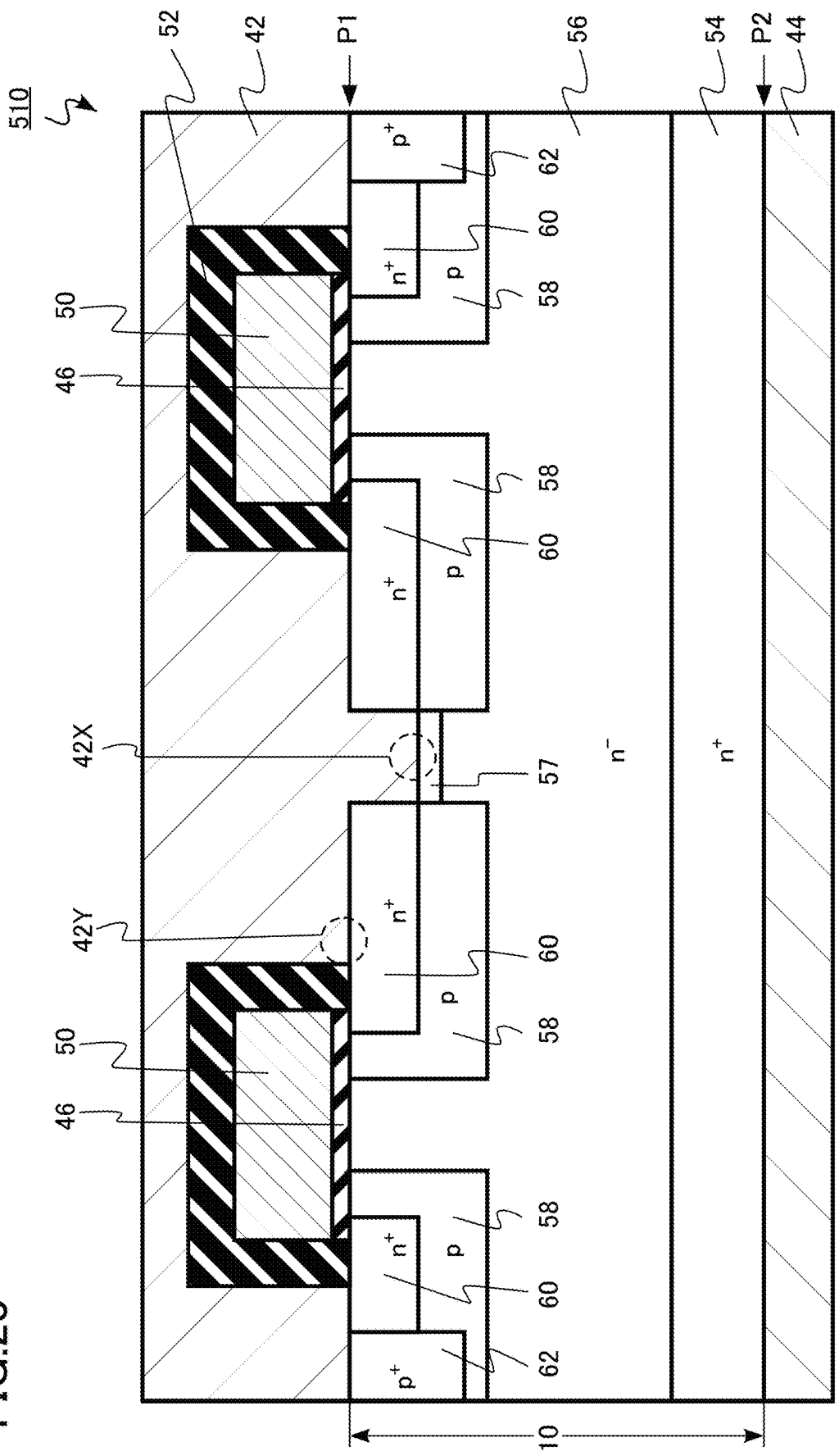
FIG. 23 is a schematic cross-sectional view of a semiconductor device according to a modified example of the fifth embodiment.
Figure 24:
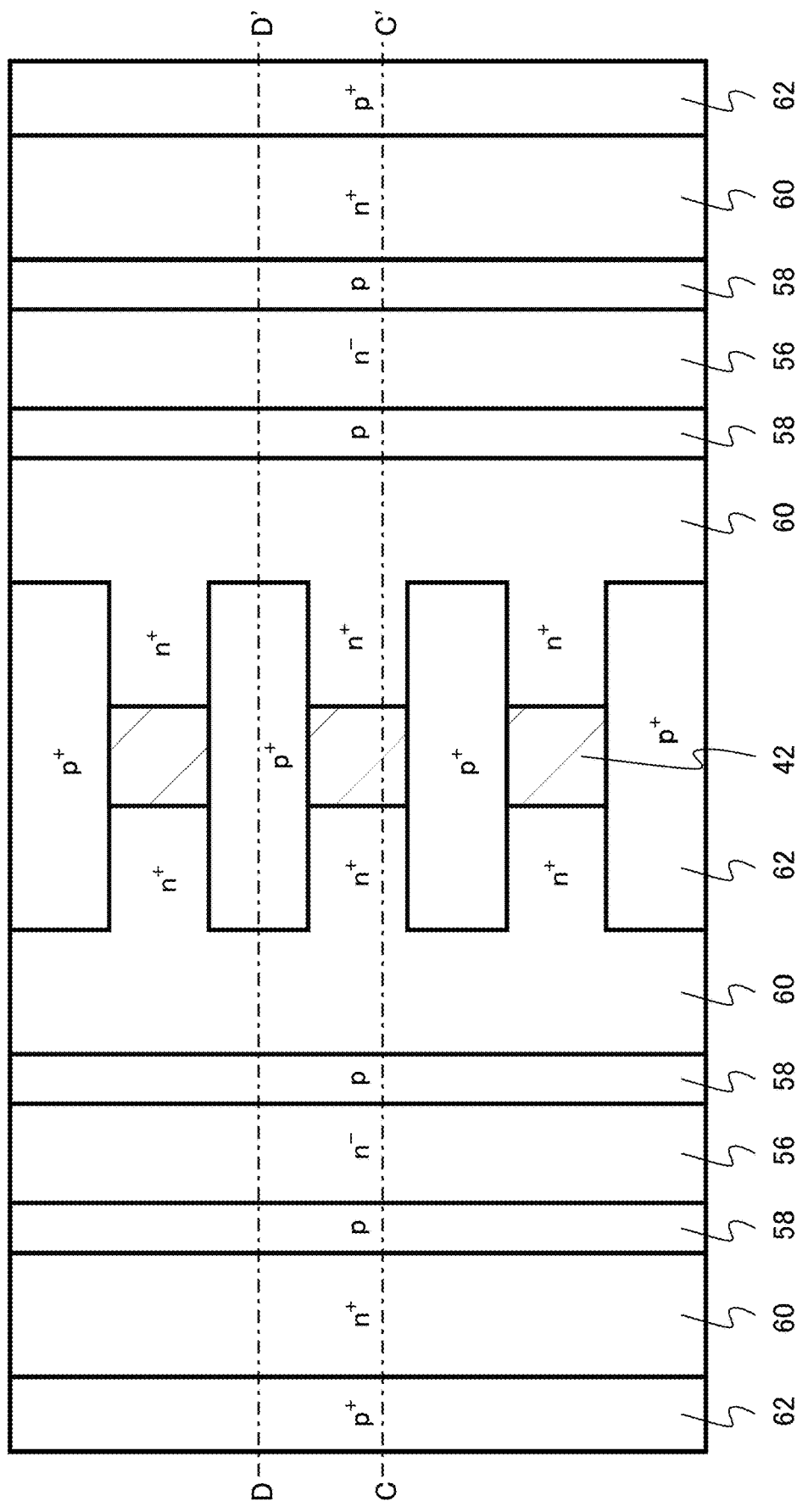
FIG. 24 is a schematic top view of the semiconductor device according to the modified example of the fifth embodiment.
Figure 25:
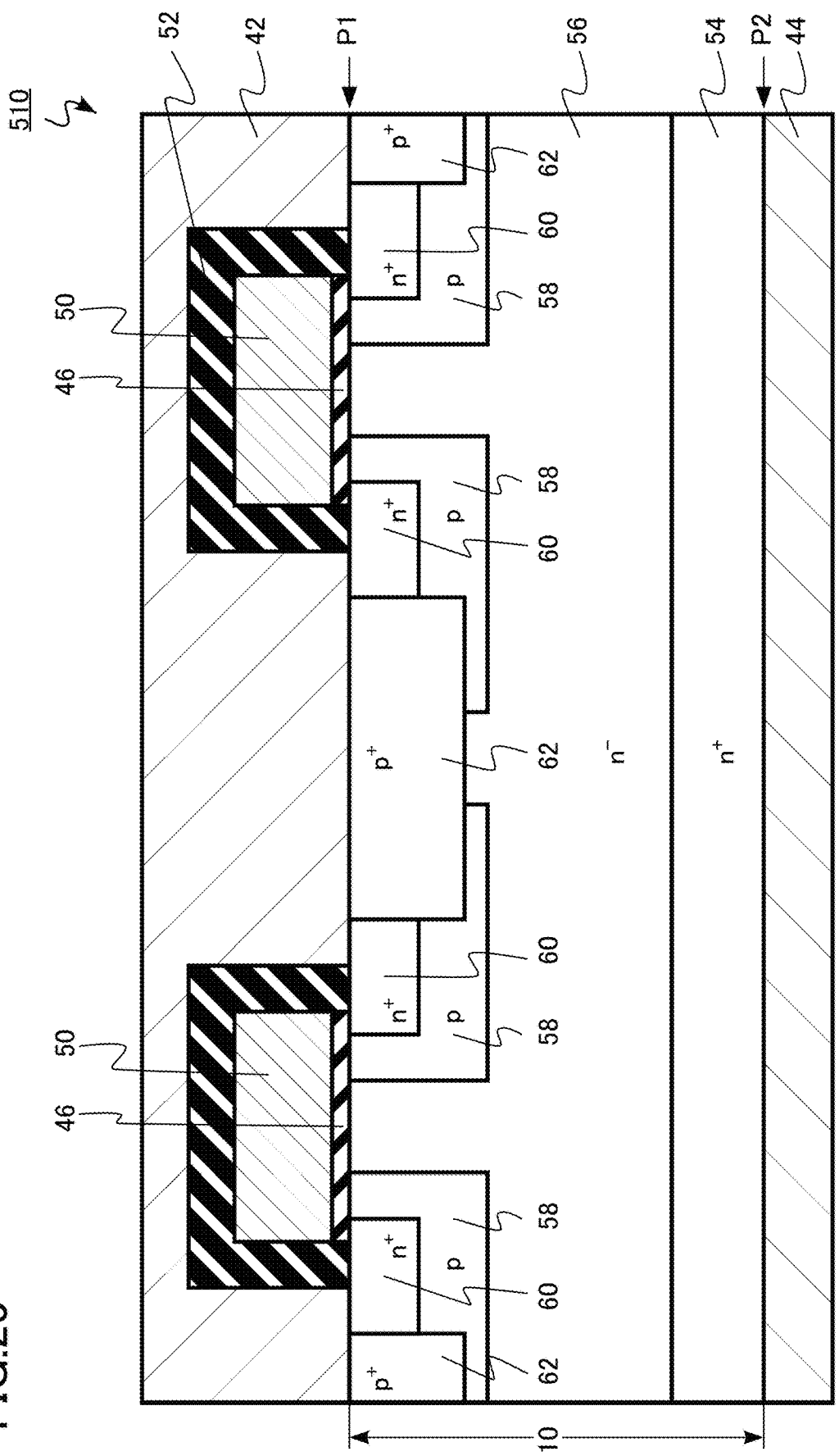
FIG. 25 is a schematic cross-sectional view of the semiconductor device according to the modified example of the fifth embodiment.

FIG. 23 is a schematic cross-sectional view of the semiconductor device of according to Modified Example of the fifth embodiment. FIG. 24 is a schematic top view of the semiconductor device according to Modified Example of the fifth embodiment. FIG. 25 is a schematic cross-sectional view of the semiconductor device according to Modified Example of the fifth embodiment. FIG. 23 illustrates a cross section taken along line CC' of FIG. 24. FIG. 25 illustrates a cross section taken along line DD' of FIG. 24.

The semiconductor device according to Modified Example of the fifth embodiment is a planar gate type vertical MOSFET 510.

A portion of the source electrode 42 is filled in the groove provided in the silicon carbide layer 10. The source region 60 is in contact with the side surface of the portion of the source electrode 42 filled in the groove.

As illustrated in FIG. 24, on the first plane P1 of the silicon carbide layer 10, the source region 60 is interposed between the p-well contact regions 62.

The oxygen region 57 is surrounded by the p-well contact region 62 and the p-well region 58.

According to the MOSFET 510, as compared with the MOSFET 500, the electrical resistance between the source electrode 42 and the source region 60 is reduced. Therefore, as compared with the MOSFET 500, the on-resistance of the MOSFET 510 is reduced. In other words, as compared with the MOSFET 500, the on-current of the MOSFET 510 increases.

As described above, according to the fifth embodiment and the modified examples thereof, it is possible to realize a semiconductor device in which a variation in height of the Schottky barrier is suppressed. In addition, it is possible to realize a semiconductor device having a simple device structure and a simple manufacturing process.

Sixth Embodiment

A semiconductor device according to a sixth embodiment is different from the semiconductor device according to the third embodiment in that the semiconductor device includes a gate trench and a source trench. Hereinafter, a portion of the descriptions of the contents overlapping with the third embodiment will be omitted.

Figure 26:
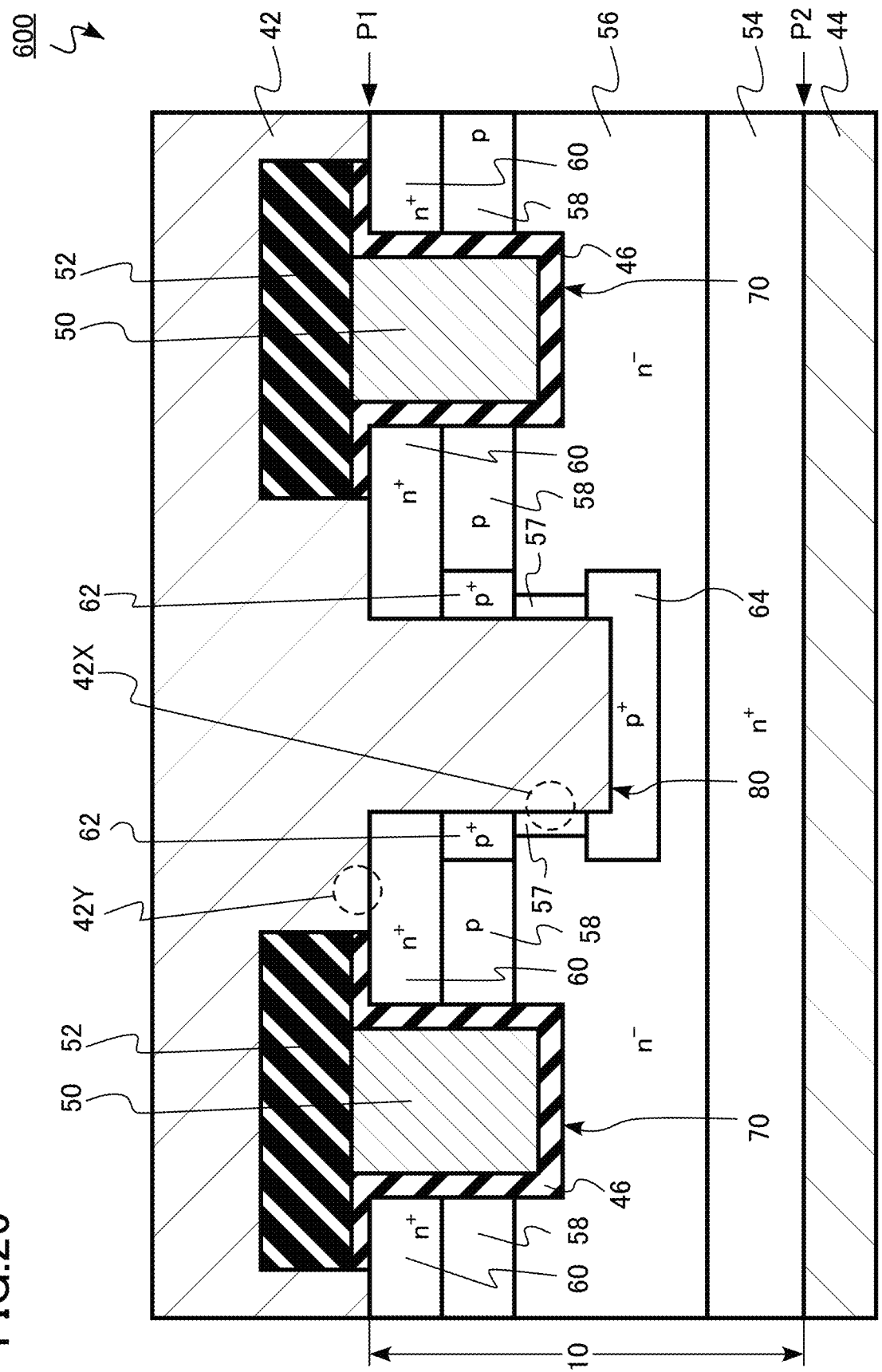
FIG. 26 is a schematic cross-sectional view of a semiconductor device according to a sixth embodiment.

FIG. 26 is a schematic cross-sectional view of the semiconductor device according to the sixth embodiment. The semiconductor device according to the sixth embodiment is a trench gate type vertical MOSFET 600. In addition, in the MOSFET 600, a portion of the source electrode is provided in the source trench. The MOSFET 600 is a MOSFET having a so-called double trench structure. The MOSFET 600 is an n-channel transistor using electrons as carriers.

The MOSFET 600 includes an SBD as an embedded diode. The SBD, which is an embedded diode, has a structure similar to that of the SBD 100 in the first embodiment.

The MOSFET 600 includes a silicon carbide layer 10, a source electrode 42 (first electrode), a drain electrode 44 (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), an oxygen region 57 (second silicon carbide region), a p-well region 58 (third silicon carbide region), a source region 60 (fourth silicon carbide region), a p-well contact region 62, an electric field relaxation region 64, a gate trench 70, and a source trench 80.

The gate trench 70 is provided on the side of the first plane P1 of the silicon carbide layer 10. The depth of the gate trench 70 is larger than the depth of the p-well region 58.

The gate insulating layer 46 is provided in the gate trench 70. The gate electrode 50 is provided in the gate trench 70. The gate electrode 50 is provided on the gate insulating layer 46.

The source trench 80 is provided on the side of the first plane P1 of the silicon carbide layer 10. The depth of the source trench 80 is larger than the depth of the p-well region 58.

A portion of the source electrode 42 is provided in the source trench 80. The oxygen region 57 and the source electrode 42 are in contact with each other on the side surface of the source trench 80. The p-well contact region 62 and the source electrode 42 are in contact with each other on the side surface of the source trench 80.

The electric field relaxation region 64 is made of $p^+$ type SiC. The electric field relaxation region 64 is provided between the drift region 56 and the source trench 80. The electric field relaxation region 64 is provided at the bottom of the source trench 80. The electric field relaxation region 64 has a function of reducing the field strength applied to the gate insulating layer 46 in the gate trench 70.

The electric field relaxation region 64 contains, for example, aluminum as a p-type impurity. The concentration of p-type impurities in the electric field relaxation region 64 is, for example, $1 \times 10^{18}$ cm$^{-3}$ or more and $1 \times 10^{22}$ cm$^{-3}$ or less. The concentration of p-type impurities in the electric field relaxation region 64 is higher than the concentration of p-type impurities in the p-well region 58.

According to the MOSFET 600 of the sixth embodiment, scaling-down is possible by providing the double trench structure, and thus, it is possible to reduce the on-resistance per unit area.

As described above, according to the sixth embodiment, it is possible to realize a semiconductor device in which a variation in height of the Schottky barrier is suppressed. In addition, it is possible to realize a semiconductor device having a simple device structure and a simple manufacturing process. In addition, it is possible to realize a semiconductor device capable of reducing the on-resistance per unit area.

Seventh Embodiment

A semiconductor device according to a seventh embodiment is different from the semiconductor device according to the sixth embodiment in that the oxygen region is provided at the bottom of the source trench. Hereinafter, a portion of the descriptions of the contents overlapping with the sixth embodiment will be omitted.

Figure 27:
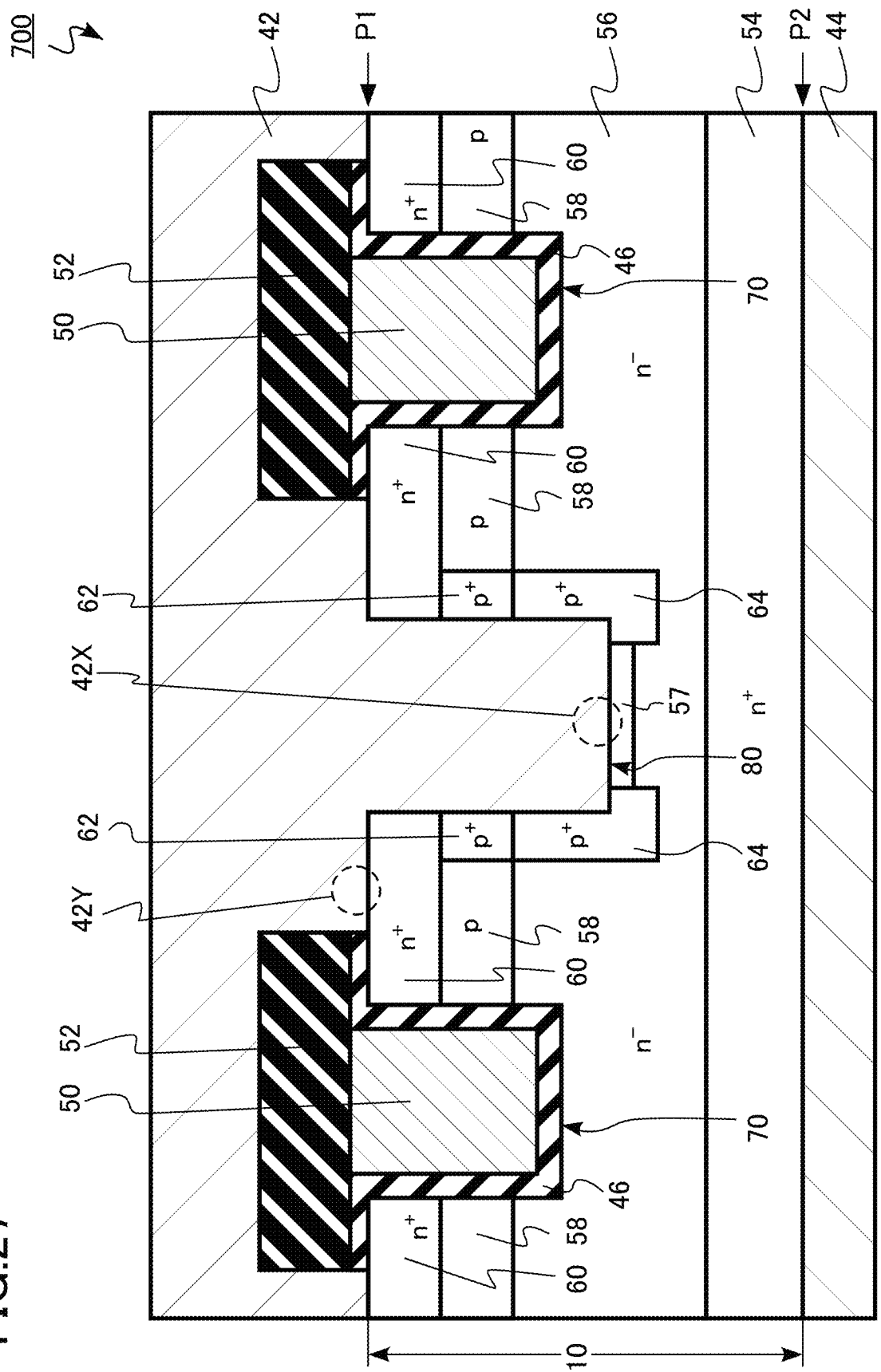
FIG. 27 is a schematic cross-sectional view of a semiconductor device according to a seventh embodiment.

FIG. 27 is a schematic cross-sectional view of the semiconductor device according to the seventh embodiment. The semiconductor device according to the seventh embodiment is a trench gate type vertical MOSFET 700. In addition, in the MOSFET 700, a portion of the source electrode is provided in the source trench. The MOSFET 700 is a MOSFET having a so-called double trench structure. The MOSFET 700 is an n-channel transistor using electrons as carriers.

The MOSFET 700 includes an SBD as an embedded diode. The SBD, which is an embedded diode, has a structure similar to that of the SBD 100 in the first embodiment.

The MOSFET 700 includes a silicon carbide layer 10, a source electrode 42 (first electrode), a drain electrode 44 (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), an oxygen region 57 (second silicon carbide region), a p-well region 58 (third silicon carbide region), a source region 60 (fourth silicon carbide region), a p-well contact region 62, an electric field relaxation region 64, a gate trench 70, and a source trench 80.

A portion of the source electrode 42 is provided in the source trench 80. The oxygen region 57 and the source electrode 42 are in contact with the bottom of the source trench 80. The p-well contact region 62 and the source electrode 42 are in contact with each other on the side surface of the source trench 80.

The electric field relaxation region 64 is made of $p^+$ type SiC. The electric field relaxation region 64 is provided between the drift region 56 and the gate trench 70.

According to the MOSFET 700 of the seventh embodiment, scaling-down is possible by providing the double trench structure, and thus, it is possible to reduce the on-resistance per unit area.

As described above, according to the seventh embodiment, it is possible to realize a semiconductor device in which a variation in height of the Schottky barrier is suppressed. In addition, it is possible to realize a semiconductor device having a simple device structure and a simple manufacturing process. In addition, it is possible to realize a semiconductor device capable of reducing the on-resistance per unit area.

Eighth Embodiment

A semiconductor device according to an eighth embodiment is different from the semiconductor device according to the sixth embodiment in that two source trenches are provided and the oxygen region and the first electrode are in contact with each other on the first plane. Hereinafter, a portion of the descriptions of the contents overlapping with the sixth embodiment will be omitted.

Figure 28:
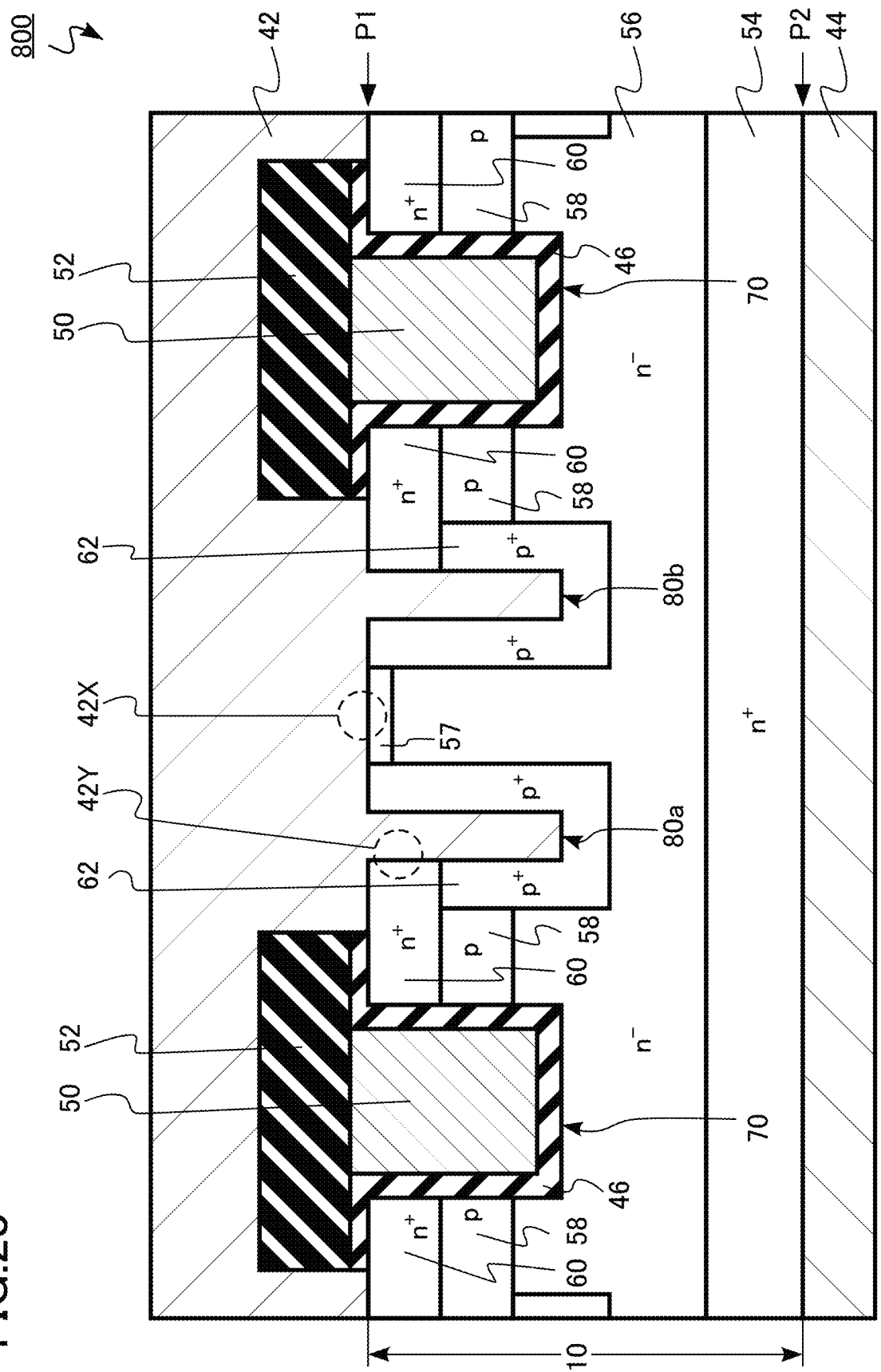
FIG. 28 is a schematic cross-sectional view of a semiconductor device according to an eighth embodiment.
Figure 29:
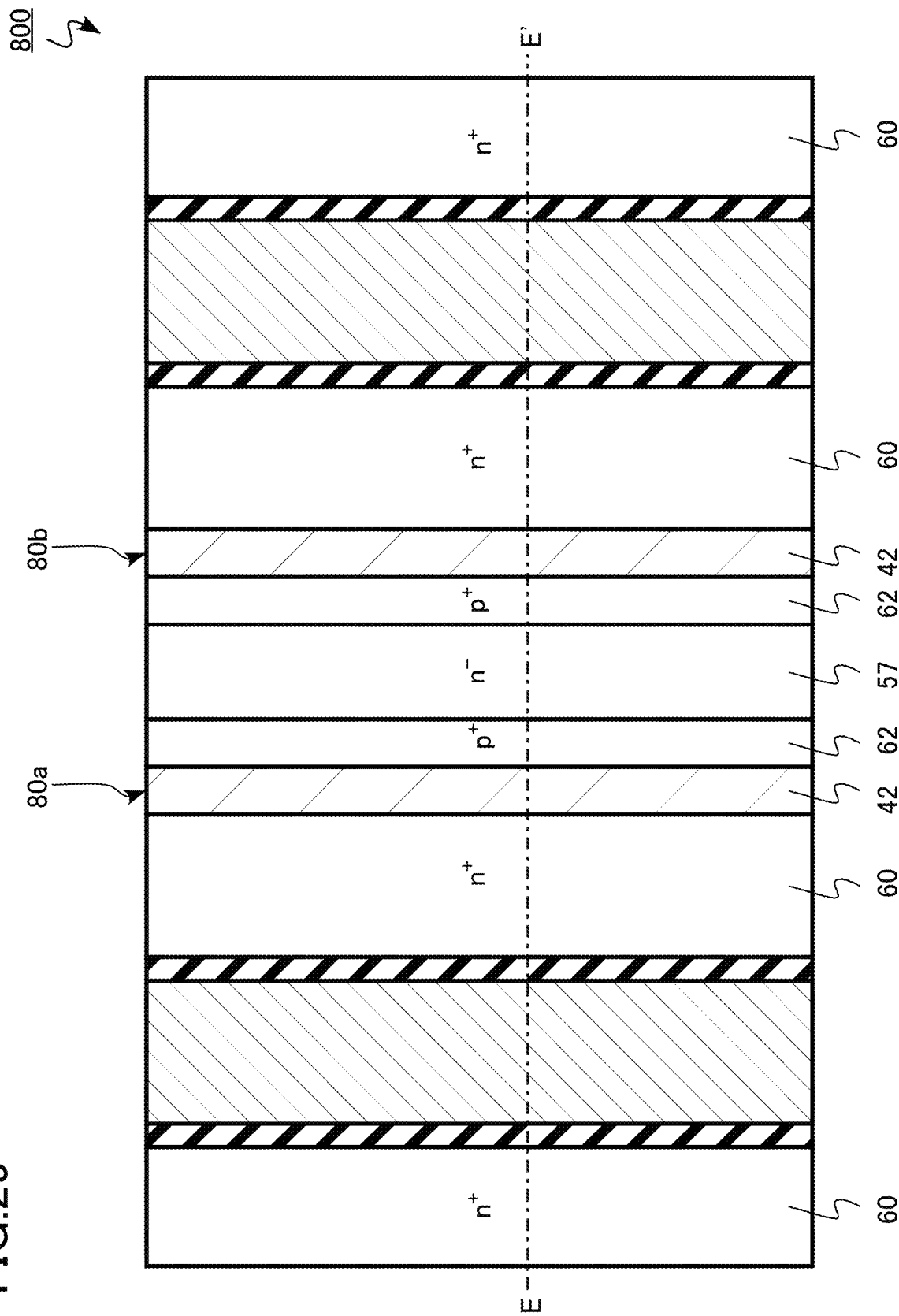
FIG. 29 is a schematic top view of the semiconductor device according to the eighth embodiment.

FIG. 28 is a schematic cross-sectional view of the semiconductor device according to the eighth embodiment. FIG. 29 is a schematic top view of the semiconductor device according to the eighth embodiment. FIG. 28 illustrates a cross section taken along line EE' of FIG. 29.

The semiconductor device according to the eighth embodiment is a trench gate type vertical MOSFET 800. In addition, in the MOSFET 800, a portion of the source electrode is provided in the source trench. The MOSFET 800 is a MOSFET having a so-called double trench structure. The MOSFET 800 is an n-channel transistor using electrons as carriers.

The MOSFET 800 includes an SBD as an embedded diode. The SBD, which is an embedded diode, has a structure similar to that of the SBD 100 in the first embodiment. In addition, the embedded diode is an MPS diode.

The MOSFET 800 includes a silicon carbide layer 10, a source electrode 42 (first electrode), a drain electrode 44 (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), an oxygen region 57 (second silicon carbide region), a p-well region 58 (third silicon carbide region), a source region 60 (fourth silicon carbide region), a p-well contact region 62, a gate trench 70, a first source trench 80a, and a second source trench 80b.

A portion of the source electrode 42 is provided in the first source trench 80a and the second source trench 80b. The oxygen region 57 and the source electrode 42 are in contact with each other on the first plane P1.

The oxygen region 57 is interposed between the first source trench 80a and the second source trench 80b. The oxygen region 57 is interposed between the p-well contact regions 62. The oxygen region 57 is in contact with the p-well contact region 62. The p-well contact region 62 also functions as an electric field relaxation region.

As described above, according to the eighth embodiment, it is possible to realize a semiconductor device in which a variation in height of the Schottky barrier is suppressed. In addition, it is possible to realize a semiconductor device having a simple device structure and a simple manufacturing process. In addition, it is possible to realize a semiconductor device capable of reducing the on-resistance per unit area.

Ninth Embodiment

A semiconductor device according to a ninth embodiment is different from the semiconductor device according to the eighth embodiment in that another trench is further provided between the two source trenches. Hereinafter, a portion of the descriptions of the contents overlapping with the eighth embodiment will be omitted.

Figure 30:
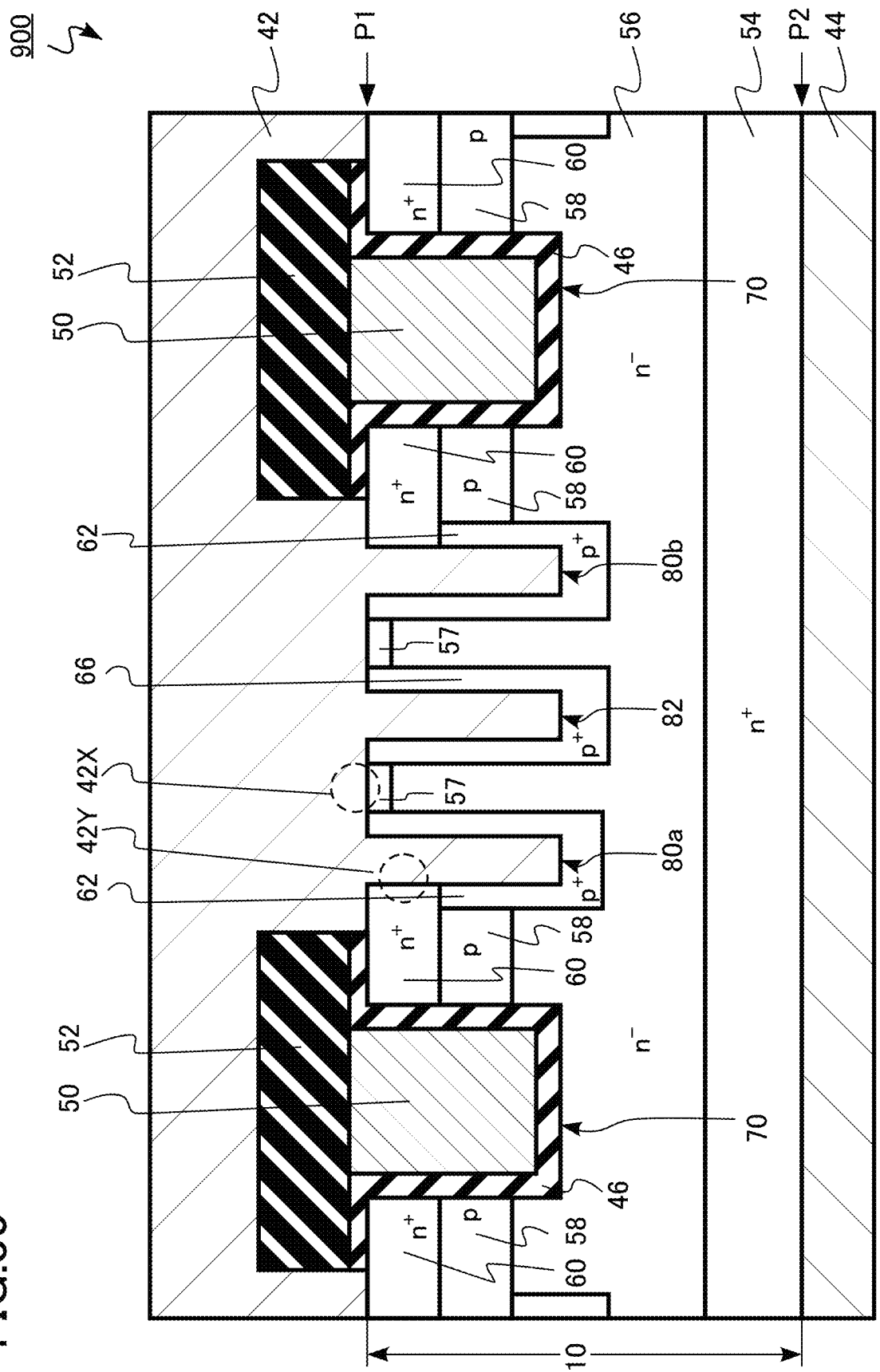
FIG. 30 is a schematic cross-sectional view of a semiconductor device according to a ninth embodiment.

FIG. 30 is a schematic cross-sectional view of the semiconductor device according to the ninth embodiment. FIG. 30 is a diagram corresponding to FIG. 28 of the eighth embodiment.

The semiconductor device according to the ninth embodiment is a trench gate type vertical MOSFET 900. In addition, in the MOSFET 900, a portion of the source electrode is provided in the source trench. The MOSFET 900 is a MOSFET having a so-called double trench structure. The MOSFET 900 is an n-channel transistor using electrons as carriers.

The MOSFET 900 includes an SBD as an embedded diode. The SBD, which is an embedded diode, has a structure similar to that of the SBD 100 in the first embodiment. In addition, the embedded diode is an MPS diode.

The MOSFET 900 includes a silicon carbide layer 10, a source electrode 42 (first electrode), a drain electrode 44 (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), an oxygen region 57 (second silicon carbide region), a p-well region 58 (third silicon carbide region), a source region 60 (fourth silicon carbide region), a p-well contact region 62, a p-region 66, a gate trench 70, a first source trench 80a, a second source trench 80b, and an intermediate trench 82.

The intermediate trench is provided between the first source trench 80a and the second source trench 80b.

A portion of the source electrode 42 is provided in the first source trench 80a, the second source trench 80b, and the intermediate trench 82. The oxygen region 57 and the source electrode 42 are in contact with each other on the first plane P1.

The oxygen region 57 is interposed between the first source trench 80a and the intermediate trench 82.

The oxygen region 57 is interposed between the intermediate trench 82 and the second source trench 80b. The oxygen region 57 is interposed between the p-well contact region 62 and the p-region 66. The oxygen region 57 is in contact with the p-well contact region 62 and the p-region 66.

As described above, according to the ninth embodiment, it is possible to realize a semiconductor device in which a variation in height of the Schottky barrier is suppressed. In addition, it is possible to realize a semiconductor device having a simple device structure and a simple manufacturing process. In addition, it is possible to realize a semiconductor device capable of reducing the on-resistance per unit area.

Tenth Embodiment

An inverter circuit and a drive device according to a tenth embodiment are an inverter circuit and a drive device including the semiconductor device according to the third embodiment.

Figure 31:
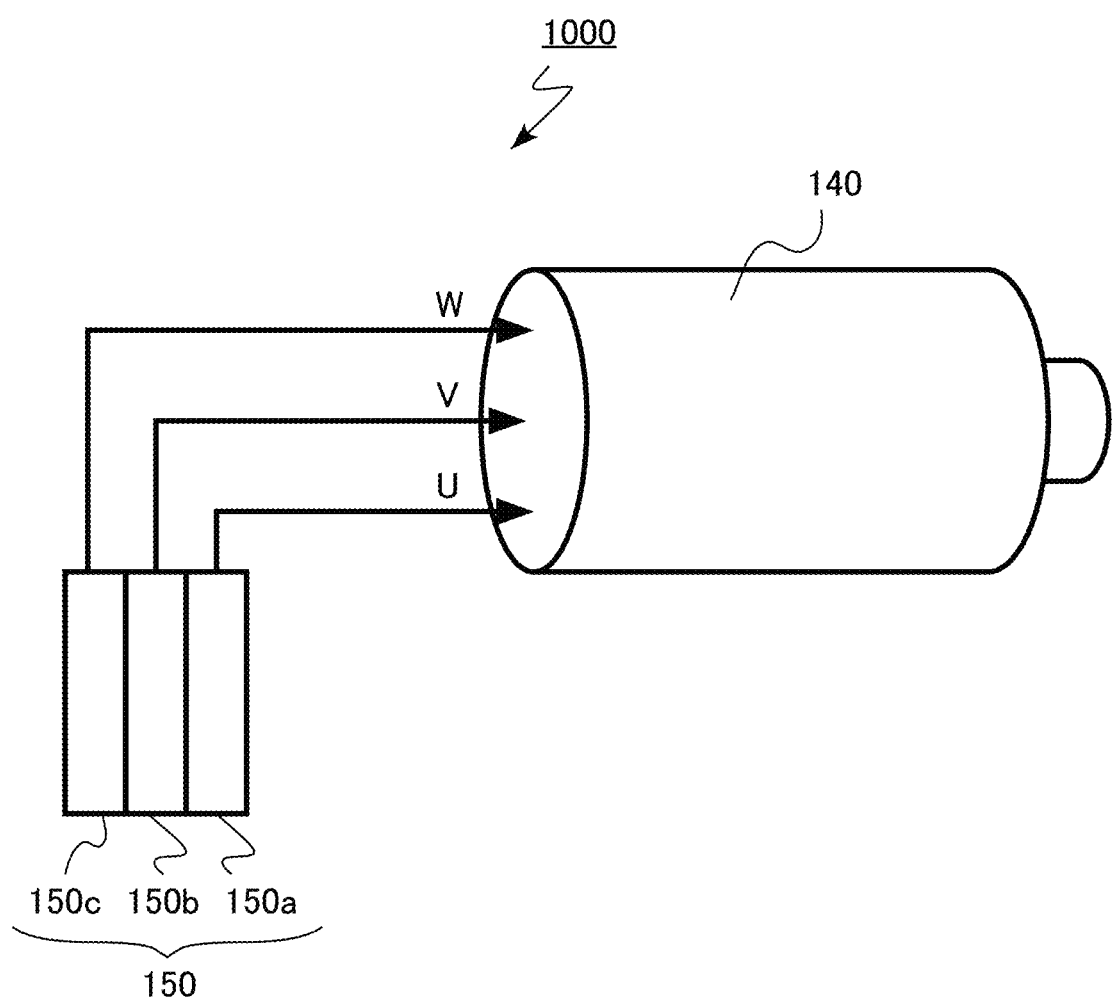
FIG. 31 is a schematic view of a drive device according to a tenth embodiment.

FIG. 31 is a schematic view of the drive device according to the tenth embodiment. The drive device 1000 includes a motor 140 and an inverter circuit 150.

The inverter circuit 150 is configured with three semiconductor modules 150a, 150b, and 150c using the MOSFET 300 according to the third embodiment as a switching element. By connecting the three semiconductor modules 150a, 150b, and 150c in parallel, a three-phase inverter circuit 150 having three AC voltage output terminals U, V, and W is realized. The motor 140 is driven by the AC voltage output from the inverter circuit 150.

According to the tenth embodiment, the MOSFET 300 with improved characteristics is provided, so that the characteristics of the inverter circuit 150 and the drive device 1000 are improved.

Eleventh Embodiment

A vehicle according to an eleventh embodiment is a vehicle including the semiconductor device according to the third embodiment.

Figure 32:
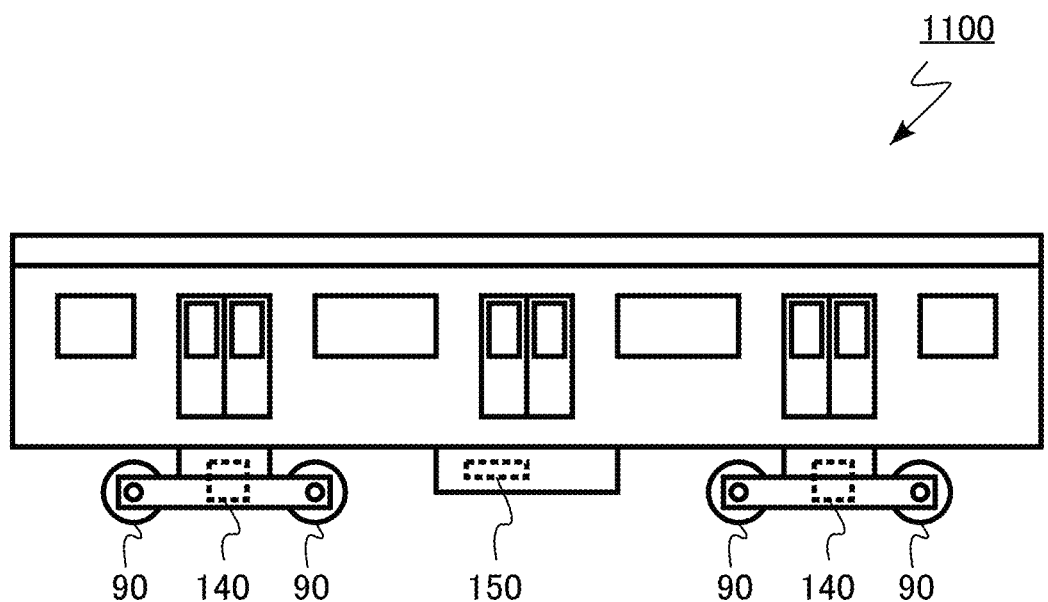
FIG. 32 is a schematic view of a vehicle according to an eleventh embodiment.

FIG. 32 is a schematic view of the vehicle according to the eleventh embodiment. The vehicle 1100 according to the eleventh embodiment is a railroad vehicle. The vehicle 1100 includes a motor 140 and an inverter circuit 150.

The inverter circuit 150 is configured with three semiconductor modules using the MOSFET 300 according to the third embodiment as a switching element. By connecting the three semiconductor modules in parallel, a three-phase inverter circuit 150 having three AC voltage output terminals U, V, and W is realized. The motor 140 is driven by the AC voltage output from the inverter circuit 150. Wheels 90 of the vehicle 1100 are rotated by the motor 140.

According to the eleventh embodiment, the MOSFET 300 with improved characteristics is provided, so that the characteristics of the vehicle 1100 are improved.

Twelfth Embodiment

A vehicle according to a twelfth embodiment is a vehicle including the semiconductor device according to the third embodiment.

Figure 33:
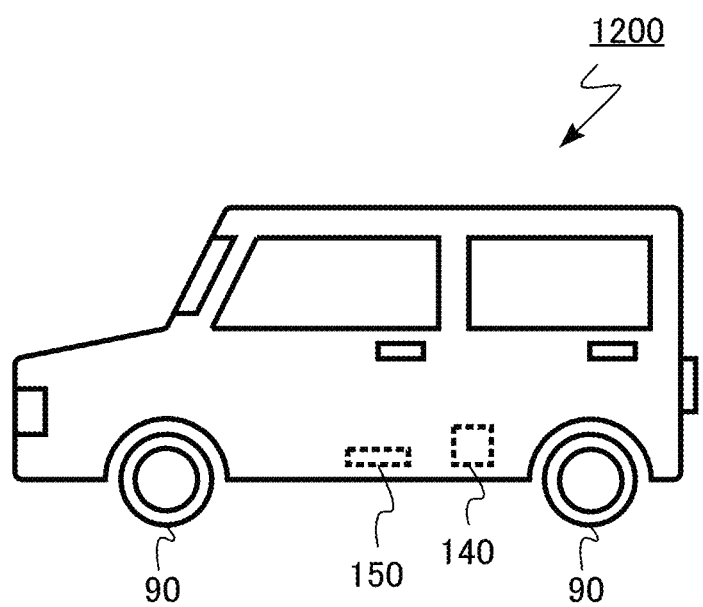
FIG. 33 is a schematic view of a vehicle according to a twelfth embodiment.

FIG. 33 is a schematic view of the vehicle according to the twelfth embodiment. The vehicle 1200 according to the twelfth embodiment is an automobile. The vehicle 1200 includes a motor 140 and an inverter circuit 150.

The inverter circuit 150 is configured with three semiconductor modules using the MOSFET 300 according to the third embodiment as a switching element. By connecting the three semiconductor modules in parallel, a three-phase inverter circuit 150 having three AC voltage output terminals U, V, and W is realized.

The motor 140 is driven by the AC voltage output from the inverter circuit 150. Wheels 90 of the vehicle 1200 are rotated by the motor 140.

According to the twelfth embodiment, the MOSFET 300 with improved characteristics is provided, so that the characteristics of the vehicle 1200 are improved.

Thirteenth Embodiment

An elevator according to a thirteenth embodiment is an elevator including the semiconductor device according to the third embodiment.

Figure 34:
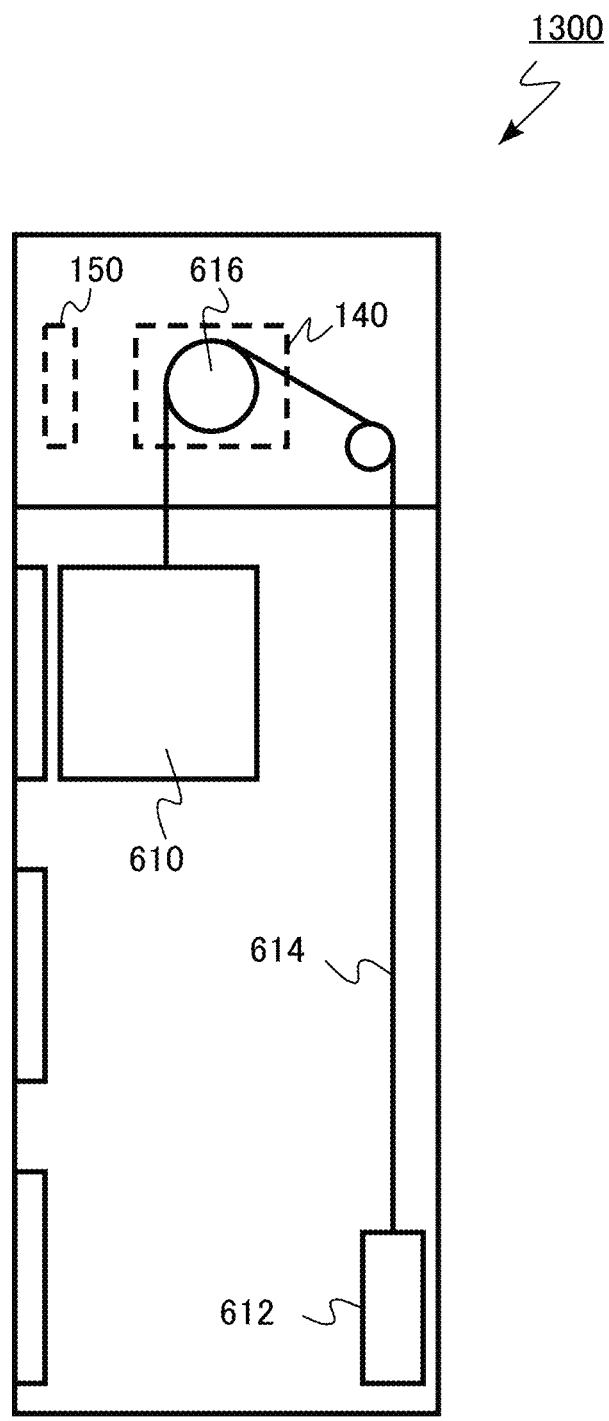
FIG. 34 is a schematic view of an elevator according to a thirteenth embodiment.

FIG. 34 is a schematic view of the elevator according to the thirteenth embodiment. The elevator 1300 according to the thirteenth embodiment includes a car 610, a counterweight 612, a wire rope 614, a hoisting machine 616, a motor 140, and an inverter circuit 150.

The inverter circuit 150 is configured with three semiconductor modules using the MOSFET 300 according to the third embodiment as a switching element. By connecting the three semiconductor modules in parallel, a three-phase inverter circuit 150 having three AC voltage output terminals U, V, and W is realized.

The motor 140 is driven by the AC voltage output from the inverter circuit 150. The hoisting machine 616 is rotated by the motor 140, and the car 610 is moved up and down.

According to the thirteenth embodiment, the MOSFET 300 with improved characteristics is provided, so that the characteristics of the elevator 1300 are improved.

As described above, in the first to ninth embodiments, the case of 4H—SiC as a crystal structure of the silicon carbide has been described as an example, but the embodiments can also be applied to the silicon carbide having a crystal structure of 3C—SiC or 6H—SiC.

In addition, the embodiments can also be applied to merged PiN Schottky (MPS) diodes. For example, in FIG. 13 of the second embodiment, if the p-type region 26 (third silicon carbide region) and the anode electrode 12 are come into an ohmic contact, an MPS is formed. At this time, by the oxygen region 20 (second silicon carbide region), a Schottky contact having a stable barrier between the drift region 18 and the anode electrode 12 is formed.

In addition, in the first to ninth embodiments, a case where the n-type impurity is nitrogen or phosphorus has been described as an example, but arsenic (As) or antimony (Sb) can also be applied as the n-type impurity.

In addition, in the first to ninth embodiments, a case where the p-type impurity is aluminum or boron has been described as an example, but gallium (Ga) or indium (In) can also be applied as the p-type impurity.

In addition, in the tenth to thirteenth embodiments, a case where the semiconductor devices according to the embodiments are applied to a vehicle or an elevator has been described as an example, but the semiconductor devices according to the embodiments can also be applied to, for example, a power conditioner of a photovoltaic power generation system, or the like.

In addition, in the tenth to thirteenth embodiments, a case where the semiconductor device according to the third embodiment is applied has been described as an example, but for example, the semiconductor devices according to the fourth to ninth embodiments can also be applied.

While certain embodiments have been described, these embodiments have been presented by way of example only, and are not intended to limit the scope of the inventions. Indeed, semiconductor devices, methods of manufacturing semiconductor device, inverter circuits, drive devices, vehicles, and elevators described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
performing ion implantation of oxygen into a silicon carbide layer having a first silicon carbide region of an n-type;
performing a first heat treatment after the performing ion implantation;
forming a conductive film directly on the silicon carbide layer after the performing the first heat treatment; and
performing a second heat treatment after the forming a conductive film, a temperature of the first heat treatment is higher than a temperature of the second heat treatment.

2. The method of manufacturing a semiconductor device according to claim 1 further comprising:
forming an oxide film on the silicon carbide layer before the performing the ion implantation; and
removing the oxide film after the performing ion implantation before the forming the conductive film.

3. The method of manufacturing a semiconductor device according to claim 1, wherein the temperature of the second heat treatment is 300° C. or more and 700° C. or less.

4. The method of manufacturing a semiconductor device according to claim 1, wherein the temperature of the first heat treatment is 800° C. or more and 1000° C. or less.

* * * * *